(12) United States Patent
Ball et al.

(10) Patent No.: US 11,768,252 B2
(45) Date of Patent: Sep. 26, 2023

(54) ARC FAULT DETECTION BASED ON PHOTOVOLTAIC OPERATING CHARACTERISTICS AND EXTRACTION OF PINK NOISE BEHAVIOR

(71) Applicants: MERSEN USA EP CORP., Boonton, NJ (US); Northeastern University, Boston, MA (US)

(72) Inventors: Roy A. Ball, Coral Springs, FL (US); Jonathan C. Kim, Brighton, MA (US); Bradley M. Lehman, Belmont, MA (US)

(73) Assignees: MERSEN USA EP CORP., Boonton, NJ (US); Northeastern University, Boston, MA (US)

( * ) Notice: Subject to any disclaimer, the term of this patent is extended or adjusted under 35 U.S.C. 154(b) by 0 days.

(21) Appl. No.: 17/698,835

(22) Filed: Mar. 18, 2022

(65) Prior Publication Data

US 2022/0299578 A1    Sep. 22, 2022

Related U.S. Application Data

(60) Provisional application No. 63/163,388, filed on Mar. 19, 2021.

(51) Int. Cl.
*G01R 31/40* (2020.01)
*G01R 31/52* (2020.01)
*H02J 3/38* (2006.01)

(52) U.S. Cl.
CPC ............. *G01R 31/40* (2013.01); *G01R 31/52* (2020.01); *H02J 3/381* (2013.01); *H02J 2300/24* (2020.01)

(58) Field of Classification Search
CPC ......... G01R 31/40; G01R 31/52; H02J 3/381; H02J 2300/24; H02S 50/00
USPC .................................... 324/764.01, 537, 500
See application file for complete search history.

(56) References Cited

U.S. PATENT DOCUMENTS

| | | | |
|---|---|---|---|
| 10,209,165 B2 * | 2/2019 | Grunkin | G01N 1/30 |
| 2014/0322732 A1 * | 10/2014 | Krek | G01N 33/6848 |
| | | | 435/7.92 |
| 2017/0276737 A1 * | 9/2017 | Ham | G01R 31/50 |
| 2019/0140441 A1 * | 5/2019 | Li | H02H 3/06 |
| 2020/0350759 A1 * | 11/2020 | Yoscovich | H02S 50/10 |
| 2021/0067090 A1 * | 3/2021 | Zeng | H02J 3/388 |
| 2021/0351612 A1 * | 11/2021 | Fannin | G01R 31/40 |
| 2022/0099754 A1 * | 3/2022 | Cintuglu | H02J 3/26 |
| 2022/0178868 A1 * | 6/2022 | Fuhrmann | B01L 3/502715 |

OTHER PUBLICATIONS

International Search Report and Written Opinion issued in corresponding PCT/US2022/020977 dated Jun. 29, 2022.
Georgijevic, Nikola et al., "The Detection of Series Arc Fault in Photovoltaic Systems Based on the Arc Current Entropy", IEEE Transactions on Power Electronics, Institute of Electrical and Electronics Engineers, USA, vol. 31, No. 8, (Aug. 1, 2016).

(Continued)

*Primary Examiner* — Giovanni Astacio-Oquendo
(74) *Attorney, Agent, or Firm* — KUSNER & JAFFE

(57) ABSTRACT

Pink noise analysis, along with unique properties of the photovoltaic (PV) operating point of both the instantaneous current and voltage signal, is used to distinguish arc faults from other noisy loads or PV degradations.

21 Claims, 22 Drawing Sheets

(56) References Cited

OTHER PUBLICATIONS

Chen, Silei et al., "Time-Frequency Distribution Characteristic and Model Simulation of Photovoltaic Series Arc Fault With Power Electronic Equipment", IEEE Journal of Photovoltaics, IEEE, vol. 9, No. 4 (Jul. 1, 2019).

Kim, Jonathan C. et al., "A Series DC Arc Fault Detection Algorithm Based on PV Operating Characteristics and Detailed Extraction of Pink Noise Behavior", 2021 IEEE Applied Power Electronics Conference and Exposition (APEC), IEEE, pp. 989-994 (Jun. 14, 2021).

* cited by examiner

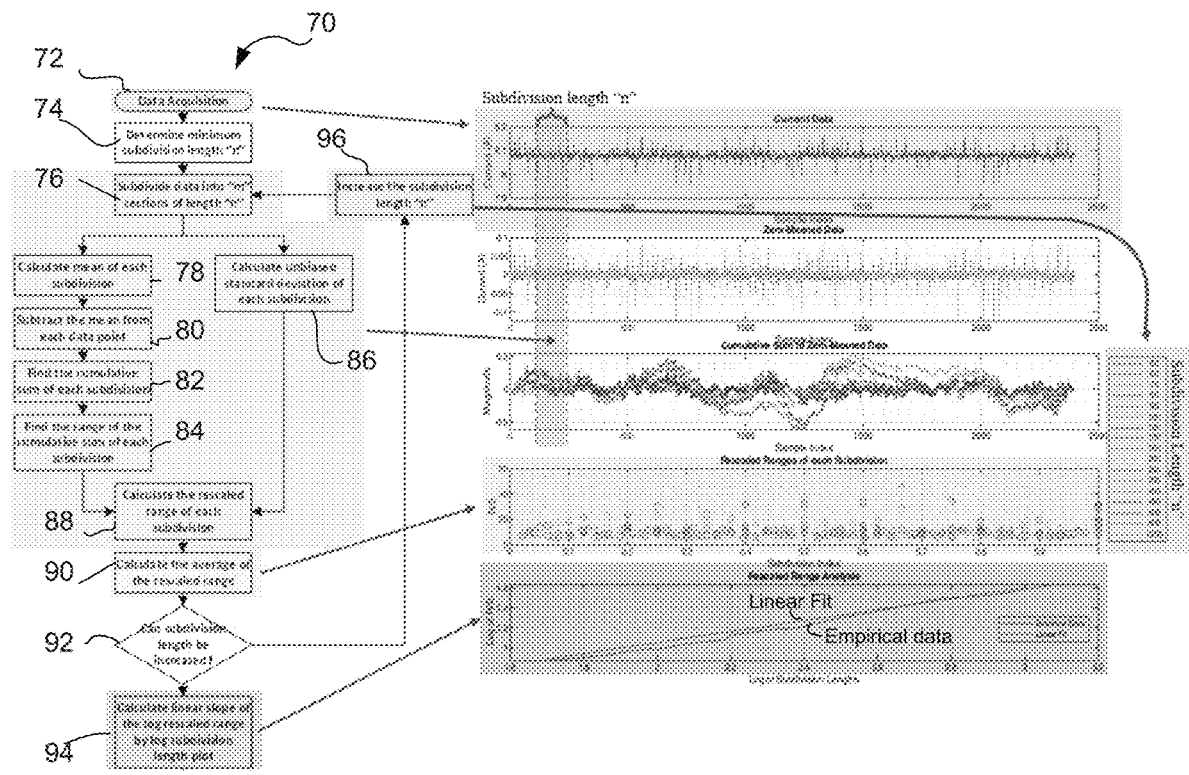

Fig. 10A

Rescaled Range Calculation (Equations)

1. Data acquisition of series length of "N"

$$\{x_i, i = 1, 2, ... N\}$$

2. Generate "m" subseries each length of "n" dividing evenly into the data $$\{y_i, i = 1, 2, ... n\}$$

3. Compute the mean of each subseries $$\overline{y_m} = \frac{1}{n}\sum_{k=1}^{n} y_{m,k} \qquad m = 1, 2, ..., \frac{N}{n}$$

4. Calculate the cumulative sum of each zero-meaned subseries $$Z_m = \sum_{k=1}^{n}(y_k - \overline{y_m})$$

5. Determine the range of each cumulative zero-meaned subseries sum $$R_m = \max(Z_m) - \min(Z_m)$$

6. Determine the unbiased standard deviation of each subseries $$S_m = \sqrt{\frac{1}{n}\sum_{k=1}^{n}(y_{m,k} - \overline{y_m})^2}$$

7. Calculate the rescaled range for each subseries $$(R/S)_m = \frac{R_m}{S_m}$$

8. Calculate the average rescaled range $$\overline{(R/S)} = \frac{1}{m}\sum_{k=1}^{m}(R/S)_k$$

Fig. 10B

ARC FAULT DETECTION BASED ON PHOTOVOLTAIC OPERATING CHARACTERISTICS AND EXTRACTION OF PINK NOISE BEHAVIOR

RELATED APPLICATION DATA

This application claims priority of U.S. Provisional Application No. 63/163,388 filed on Mar. 19, 2021, which is incorporated herein by reference in its entirety.

FIELD OF THE INVENTION

The invention relates generally to arc faults, and in particular, to methods and systems for detecting arc faults in photovoltaic systems.

BACKGROUND OF THE INVENTION

DC arc faults in photovoltaic (PV) systems are a dangerous category of faults often leading to fires and irreversible damage to system components in PV arrays. The large range of potential unwanted tripping scenarios has made it difficult for arc fault detection devices (AFDD) to correctly identify arc faults and avoid false alarms. Specifically, series DC arc faults are the most common, especially as the PV cables, connectors, and conductors deteriorate in aging PV installations and can be missed by over-current protection devices.

Traditionally, DC arc fault algorithms relied heavily on frequency domain analysis of the current signal. A Fast Fourier Transform (FFT) or similar method is used to measure the power of the frequency spectrum in the arcing frequency bandwidth (1 Hz to 100 kHz). However, these methods do not distinguish the shape or color of the increase in power at these frequencies. Therefore, unwanted tripping may occur when there is a sudden increase in noise by another source in this arcing frequency bandwidth. Discrete Wavelet Transforms (DWT)-based algorithms attempt to utilize both the time and frequency domains of the current signal by analyzing the magnitude change of the current signal during an arc fault as an extra layer of detection criteria to sort through arc-like noisy sources.

Statistical methods involving entropy or special exponents, such as the Hurst exponent, attempt to determine the type of noise injected into the system by measuring the variance or change in the noise energy. However, these methods depend on previous knowledge of the PV system to minimize switching frequencies through filtering. Machine learning algorithms classify and differentiate arc fault behavior from other transients by collecting a large number of training data of real arc fault tests. However, the random nature of different arc fault environments and dependence on the specific PV system configuration may sometimes cause false alarms. Causes of these unwanted tripping events may include: (i) electromagnetic interference (EMI); (ii) sudden changes in the load, PV array or inverter operation; (iii) switching noise from power electronic devices; (iv) AC noise coupled to the DC side of a transformerless inverter; and (v) unexpected PV configurations.

Recent research has proposed that to make AFDD more robust to false alarms. It is beneficial to incorporate algorithms based on multiple detection features, which is the approach utilized in this research. For example, Y. Gao, J. Zhang, Y. Lin and Y. Sun ("An innovative photovoltaic DC arc fault detection method through multiple criteria algorithm based on a new arc initiation method," 2014 IEEE 40th Photovoltaic Specialist Conference (PVSC), Denver, Colo., USA, 2014, pp. 3188-3192) develop three time domain characteristics and three separate frequency domain characteristics, each individually not unique to an arc fault, in their AFDD.

SUMMARY OF THE INVENTION

In accordance with an aspect of the invention, unique properties of arc fault signatures, especially for PV systems, are utilized to avoid false alarms. Specifically, it has been discovered that in the arcing frequencies between 1 Hz and 100 kHz, noise does not increase uniformly, like white noise, or with specific harmonics, like switching noise. Therefore, FFT algorithms and statistical methods can be improved by first recognizing the pink noise pattern of energy increase in the power spectrum. Additionally, the PV array exhibits unique current-voltage characteristics during the arc fault, such that by measuring both the current and voltage signals on the arcing PV string, it is possible to develop additional arc fault testing criteria that make detection algorithms more robust.

In accordance with the invention, two criteria are used to detect arc faults. More specifically, pink noise detection and a decrease in current and voltage are used to detect arc faults. A proposed algorithm in accordance with an aspect of the invention uses both the time and frequency domain of the current and voltage signals, generating three different signal features with greater detail on the pink noise characteristic of the arc fault noise and the specific transient behavior of the PV string operating point at the ignition of an arc fault. Then, a multi-layered detection criteria is implemented using only arc fault signatures as detection flags.

In accordance with aspects of the invention, a robust 'pink noise' detector is developed that can effectively distinguish unique properties of arc fault noise compared to typical load switching noise often associated with inverters and other power converters. The detector, therefore, has fewer false detections compared to traditional detectors based only on sensing increased energy of noise in a specific bandwidth. Additionally, unique properties of series arc faults in PV strings are explained, which behave differently than arc-faults with other DC sources. It is shown in PV systems that there is a simultaneous decrease in both the instantaneous current and voltage of the PV string during an arc fault. This property is utilized to make the proposed arc fault detector more robust. Further, development of a unique time and frequency domain profile for series arc fault detection in PV system is presented, whereby the system generates fewer false alarms.

According to one aspect of the invention, a method for detecting arc faults in a photovoltaic (PV) string connected to a load, wherein a voltage sensor and a current sensor are electrically connected to the PV string and operative to measure a voltage and current, respectively, supplied to the load, the method including: measuring, using a voltage sensor, a voltage output by the PV string over a prescribed time period to obtain a data set of voltage measurements; measuring, using a current sensor, a current output by the PV string over the prescribed time period to obtain a data set of current measurements; determining if the data set of voltage measurements and the data set of current measurements are simultaneously decreasing within the prescribed time period; analyzing the data set of current measurements and the data set of voltage measurements for the presence of pink noise within the prescribed time period; and concluding an arc fault has occurred when i) pink noise is present during the prescribed time period, and ii) at least a portion of the data set of voltage measurements and at least a portion of the data set of current measurements are simultaneously decreasing while pink noise is present.

In one embodiment, analyzing the data set of current measurements and the data set of voltage measurements for the presence of pink noise includes: obtaining from the data set of voltage measurements and the data set of current measurements a plurality of autocorrelation coefficients; analyzing the plurality of autocorrelation coefficients to obtain a decorrelation rate; and concluding pink noise is present when the decorrelation rate satisfies a prescribed threshold.

In one embodiment, the decorrelation rate satisfies the prescribed threshold when the decorrelation rate increases above the prescribed threshold.

In one embodiment, analyzing the plurality of autocorrelation coefficients to obtain the decorrelation rate comprises determining a slope coefficient of a linear fit of the autocorrelation coefficients, and using a negative of the slope coefficient as the decorrelation rate.

In one embodiment, determining the slope of the linear fit of the autocorrelation coefficients comprises using the equation $\hat{r}_k = -\gamma \ln k + c_1$ to perform the linear fit $\hat{r}_k$, where $-\gamma$ is the decorrelation rate, k is a non-negative integer, and $c_1$ is a constant.

In one embodiment, determining the slope coefficient comprises analyzing the linear fit $\hat{r}_k$ on a logarithmic scale.

In one embodiment, analyzing the data set of current measurements and the data set of voltage measurements for the presence of pink noise includes determining a rescaled-range (RS) coefficient based on the data set of current measurements and the data set of voltage measurements, and concluding pink noise is present when a magnitude of the RS coefficient exceeds a prescribed threshold.

In one embodiment, determining the RS coefficient includes: a) subdividing the data set of voltage measurements and the data set of current measurements in to m sections each having a subdivision length n; b) determining a rescaled range for each subdivision of the data set of voltage measurements and the data set of current measurements; c) based on the rescaled range for each subdivision, determining if the subdivision length n can be increased; d) repeating steps a-c so long as the subdivision length n can be increased; and upon the subdivision length n reaching a maximum, determining a linear slope of a log rescaled range based on the last determined rescaled range of subdivisions.

In one embodiment, determining if the subdivision length n can be increased includes determining if there is a new subdivision length n that is greater than the previously determined subdivision length n that is divisible for the length of the entire data set of voltage measurements and current measurements.

In one embodiment, calculating the rescaled range for each subdivision of the data set of voltage measurements and the data set of current measurements includes: determining an unbiased standard deviation for each subdivision of the data sets of voltage measurements and current measurements; determining a cumulative sum of each subdivision of the data sets of voltage measurements and current measurements; determining a range of the cumulative sum for each subdivision of the data sets of voltage measurements and current measurements; and determining the resealed range for each subdivision of the data sets of voltage measurements and current measurements based on the range of cumulative sum of each subdivision and the unbiased standard deviation of each subdivision.

According to another aspect of the invention, an arc fault detection system, includes: a voltage sensor connectable to a photovoltaic (PV) string; a current sensor connectable to a PV string; and a controller communicatively coupled to the voltage sensor and the current sensor to receive voltage measurements and current measurements therefrom, the controller configured to: obtain from the voltage sensor a voltage output by the PV string over a prescribed time period to obtain a data set of voltage measurements; obtain from the current sensor a current output by the PV string over the prescribed time period to obtain a data set of current measurements; determine if the data set of voltage measurements and the data set of current measurements are simultaneously decreasing within the prescribed time period; analyze the data set of current measurements and the data set of voltage measurements for the presence of pink noise within the prescribed time period; and output an indication of an arc fault when i) pink noise is present during the prescribed time period, and ii) at least a portion of the data set of voltage measurements and at least a portion of the data set of current measurements are simultaneously decreasing while pink noise is present.

In one embodiment, the controller is configured to: obtain from the data set of voltage measurements and the data set of current measurements a plurality of autocorrelation coefficients; analyze the plurality of autocorrelation coefficients to obtain a decorrelation rate; and conclude pink noise is present when the decorrelation rate satisfies a prescribed threshold.

In one embodiment, the decorrelation rate satisfies the prescribed threshold when the decorrelation rate increases above the prescribed threshold.

In one embodiment, the controller is configured to determine a slope coefficient of a linear fit of the autocorrelation coefficients, and use a negative of the slope coefficient as the decorrelation rate.

In one embodiment, the controller is configured to use the equation $\hat{r}_k = -\gamma \ln k + c_1$ to perform the linear fit $\hat{r}_k$, where $-\gamma$ is the decorrelation rate, k is a non-negative integer, and $c_1$ is a constant.

In one embodiment, the controller is configured to analyze the linear fit $\hat{r}_k$ on a logarithmic scale.

In one embodiment, the controller is configured to: determine a rescaled-range (RS) coefficient based on the data set of current measurements and the data set of voltage measurements, and conclude pink noise is present when a magnitude of the RS coefficient exceeds a prescribed threshold.

In one embodiment, the controller is configured to: a) subdivide the data set of voltage measurements and the data set of current measurements in to m sections each having a subdivision length n; b) determine a rescaled range for each subdivision of the data set of voltage measurements and the data set of current measurements; c) based on the rescaled range for each subdivision, determine if the subdivision length n can be increased; d) repeat steps a-c so long as the subdivision length n can be increased; and e) upon the subdivision length n reaching a maximum, determine a linear slope of a log rescaled range based on the last determined rescaled range of subdivisions.

In one embodiment, the controller is configured to determine if there is a new subdivision length n that is greater than the previously determined subdivision length n that is divisible for the length of the entire data set of voltage measurements and current measurements.

In one embodiment, the controller is configured to: determine an unbiased standard deviation for each subdivision of the data sets of voltage measurements and current measurements; determine a cumulative sum of each subdivision of the data sets of voltage measurements and current measurements; determine a range of the cumulative sum for each subdivision of the data sets of voltage measurements and current measurements; and determine the rescaled range for each subdivision of the data sets of voltage measurements and current measurements based on the range of cumulative sum of each subdivision and the unbiased standard deviation of each subdivision.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention may take physical form in certain parts and arrangement of parts, an embodiment of which is described in detail in the specification and illustrated in the accompanying drawings, wherein:

FIGS. 10A and 10B illustrate a method for calculating the RS coefficient in accordance with an aspect of the invention;

DETAILED DESCRIPTION OF THE INVENTION

Figure 1:
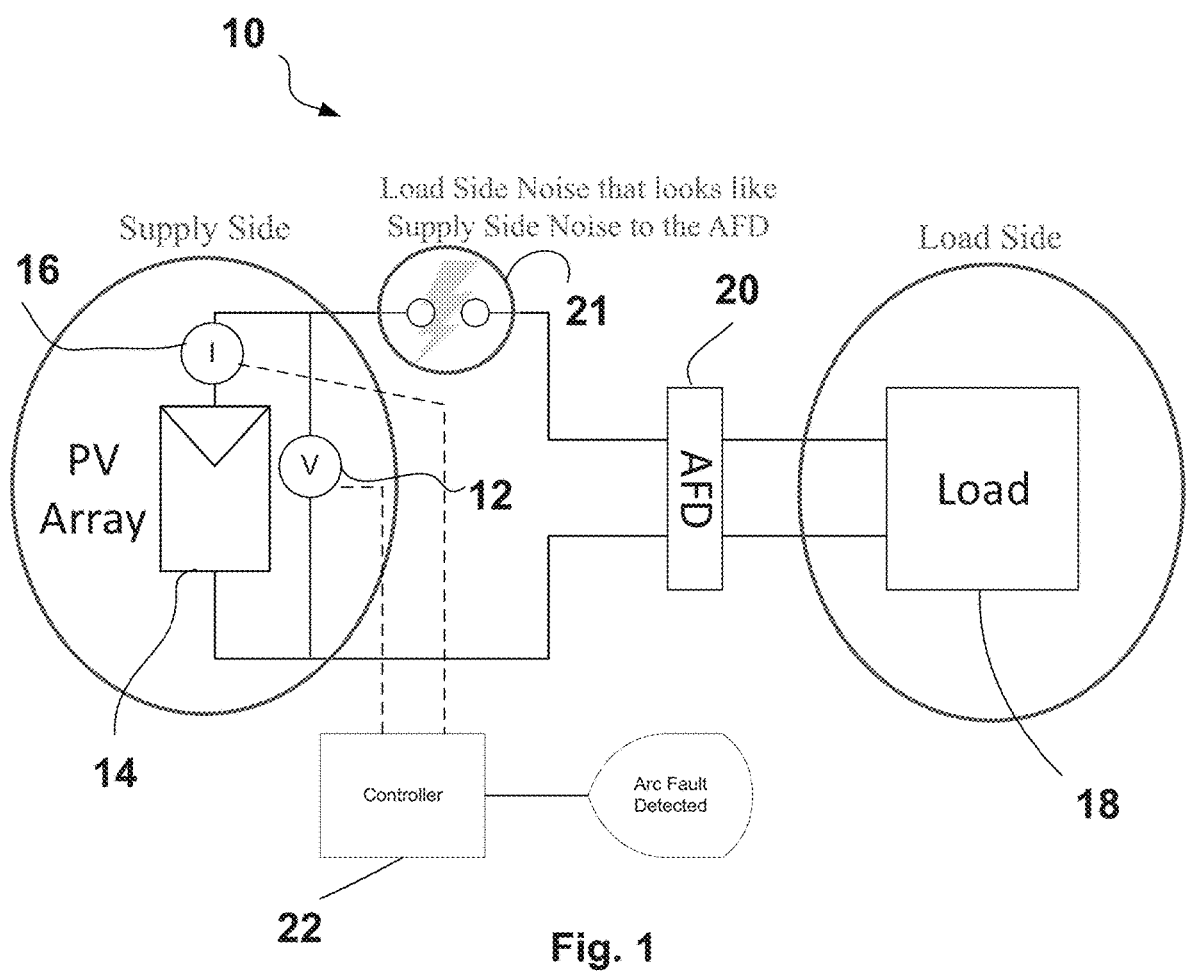
FIG. 1 illustrates an exemplary PV circuit in which arc faults may occur.

Embodiments of the present invention will now be described with reference to the drawings, wherein like reference numerals are used to refer to like elements throughout. It will be understood that the figures are not necessarily to scale.

Arc faults act as an additional load-side noise on a PV array. However, the arc fault occurs on the supply side of the arc fault detector (AFD). Therefore, although arc faults are a load-side noise, they behave like supply-side noise from the point of view of the AFD. This is illustrated in FIG. 1, which shows a system 10 for detecting arc faults. The system includes a voltage sensor 12 that measures a voltage output by a PV string 14, and a current sensor 16 that measures a current output by the PV string 14. A load 18 is connected to the PV string 14 to receive power therefrom, and an AFD 20 is connected between the PV string 14 and the load 18 and operative to detect arc faults 21. The voltage sensor 12 and current sensor 16 are operatively coupled to a controller 22 of the AFD 20 to provide the measured voltage and current thereto. The controller 22, which can be in the form of a dedicated circuit and/or can include a processor, memory, and code stored in the memory and executable by the processor, analyzes the measured data as discussed in more detail below to determine if an arc fault is occurring. If an arc fault is detected, appropriate action can be taken.

I. Series DC Arc Fault Algorithm

A DC arc fault detection method in accordance with the invention utilizes the unique operating point behavior of the current and voltage transients during the ignition of an arc fault of the measured PV string and the specific characterization of the sudden presence of pink noise on the current signal. When both signal features are identified, an arc fault is declared.

A. Arcing PV String Transient Behavior

Figure 2:
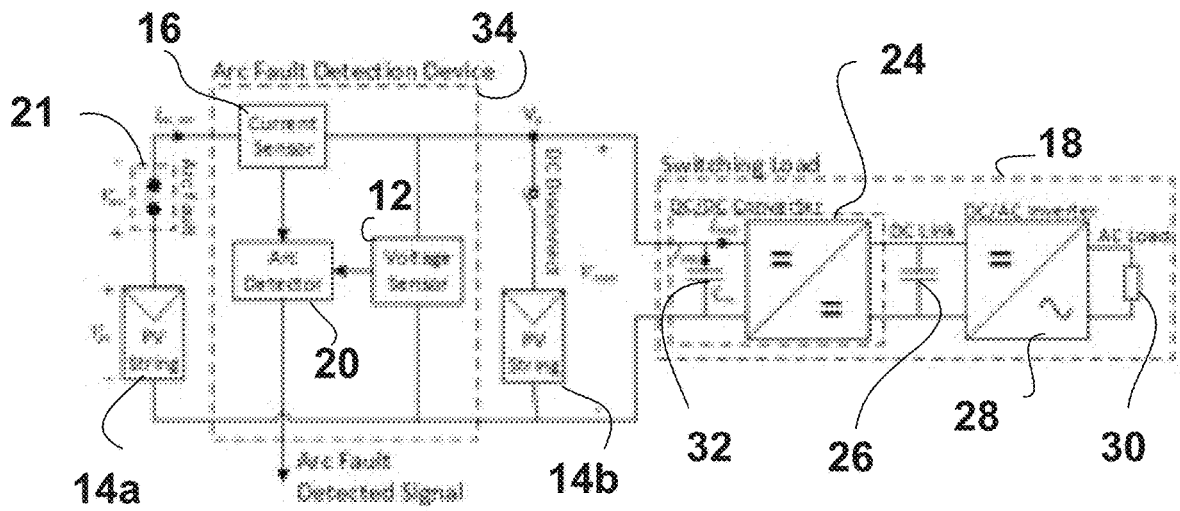
FIG. 2 illustrates a series arc fault PV simulation and experimental setup.

With reference to FIG. 2, a PV array 14a, 14b is connected to a DC/DC converter 24 with maximum power point tracking (MPPT) to determine the optimal operating point to extract the maximum PV power. The DC signal, which is provided across smoothing capacitor 26, is converted into an AC signal by DC/AC converter 28 that can either connect to a load 30 (e.g., a grid) or form an off-grid 120 Vrms, 60 Hz line.

An input capacitor 32 exists between the PV array 14b and MPPT DC/DC converter 24 to filter the PV voltage. The input capacitor 32 reacts to the current decrease generated by the arc fault with an initial decrease in the voltage rather than a voltage increase as seen from other PV side disturbances such as DC disconnects. The arcing PV current $I_{pv\_arc}$ at the AFDD 34 is shown in equation (1).

$$I_{pv\_arc} = I_{load} - I_{cap} = I_L - I_0\left[\exp\left(\frac{q(V_{load})}{nkT}\right) - 1\right] \quad \text{Equation (1)}$$

where $I_{cap}$ is the input capacitor current $C_{in}$, $V_{pv}$ is the PV string voltage, $V_{arc}$ is the arc fault voltage, $I_L$, $I_0$, n, q, k, T are constants in the single diode model of the PV array, and $I_{load}$ and $V_{load}$ are the input current and voltage of the DC-DC converter 24, respectively. The input voltage $V_{load}$ can be represented as the difference between the PV voltage, $V_{pv}$, and arc voltage, $V_{arc}$ as seen in equation (2).

$$V_{load} = V_{pv} - V_{arc} \quad \text{Equation (2)}$$

At the instant of an arc fault ignition, the electromagnetic force exerted by the voltage drop across the arc fault gap increases $V_{arc}$ from 0 V to at least 25 V depending on the gap length. Therefore, according to M. K. Alam, F. Khan, J. Johnson and J. Flicker ("A Comprehensive Review of Catastrophic Faults in PV Arrays: Types, Detection, and Mitigation Techniques," in IEEE Journal of Photovoltaics, vol. 5, no. 3, pp. 982-997, May 2015), there is an instantaneous decrease in the arcing PV current $I_{pv\_arc}$. However, at the instant of ignition, the power at the input of the load remains the same, drawing the same amount of current, $I_{load}$. Therefore, as the instantaneous DC-DC converter input voltage $V_{load}$ decreases, capacitor input current $I_{app}$ increases to compensate for the decrease in arcing PV current $I_{pv\_arc}$.

When the PV source is replaced with a DC source and an arc fault occurs, the instantaneous DC-DC converter input voltage $V_{load}$ decreases just like the PV source. However, instead of the capacitor input current $I_{cap}$ increasing to compensate for the decrease in the arcing PV current $I_{pv\_arc}$, the DC source current, $I_{dc\_arc}$, decreases to compensate for the increase in capacitor input current $I_{cap}$. Therefore, measurement and proper characterization of the operating point during an arc fault becomes useful in distinguishing between the different source disturbance scenarios.

B. Operating Point Detection Criteria

The operation point detection criteria is proposed as an indicator of the simultaneous decrease in the instantaneous current and voltage magnitudes of the PV string operating point. Specifically, the arc fault detection algorithm in accordance with the invention verifies that both the current and voltage changes are negative as shown in equations (3a) and (3b), respectively.

$$\Delta I(t_s) = \bar{I}(t_s) - \bar{I}(t_s - 1) < 0 \quad \text{Equation (3a)}$$

$$\Delta V(t_s) = \bar{V}(t_s) - \bar{V}(t_s - 1) < 0 \quad \text{Equation (3b)}$$

where $t_s$ is a time window equivalent to the maximum lag calculated for the autocorrelation coefficient, $\bar{I}(t_s)$ and $\bar{V}(t_s)$ are the arithmetic average magnitudes of the current and voltage in the time window $t_s$, and $\Delta I(t_s)$ and $\Delta V(t_s)$ are the instantaneous magnitude changes of the current and voltage at the AFDD, respectively. To eliminate false alarms from a noisy signal, current and voltage changes under the current and voltage threshold, $\Delta I_{thresh}$ and $\Delta V_{thresh}$, are set to zero to reduce jittering in the data, as seen in equation (4a) and (4b), respectively.

$$\Delta I(t_s) < \Delta I_{thresh} \rightarrow \Delta I(t_s) = 0 \quad \text{Equation (4a)}$$

$$\Delta V(t_s) < \Delta V_{thresh} \rightarrow \Delta V(t_s) = 0 \quad \text{Equation (4b)}$$

C. Extracting Pink Noise via Decorrelation Rate Analysis

Colored noise (e.g., white noise, brown noise, pink noise, etc.) describes the slope of the power spectral density (PSD) proportional to the frequency by $1/f^\beta$ defined by the exponent, $\beta$, where f is the x-axis of the PSD. In addition to the unique operating point behavior, the arc fault exhibits pink noise characteristics, $\beta=1$. The pink noise characteristics are derived from the emission of electrons from a "cathode", where the cathode is formed on one of two electrodes that have an air gap therebetween (the other electrode forming an anode), and an arc occurs across the air gap. In a thermionic emission process, the fluctuations on the surface of the electrode result in fluctuations of the electron current. The arc fault is initiated by the breakdown of the air gap through field emission and sustained by the thermionic emission process, resulting in the pink noise characteristic.

Different colored noise signals have varying levels of similarity to a delayed version of itself. The measure of similarity of a signal to itself is determined by analyzing the linear slope of the autocorrelation coefficient over the time lag, termed the decorrelation rate, $\gamma$. White noise ($\beta=0$) is a random signal with samples completely uncorrelated to the previous value. Therefore, the autocorrelation coefficients will be almost zero for any lag greater than a delay of zero, resulting in $\gamma \approx 0$. Brown noise ($\beta=2$), which is the integration of white noise, contain strong correlations with previous values, similar to signals dominated by switching noise in switching power supplies and devices. Therefore, the autocorrelation coefficients would be large and almost unchanging for lag near 1, also resulting in $\gamma \approx 0$.

Pink noise ($\beta=1$) is a special case between white noise and brown noise. It is characterized by long-range dependence (LRD) or correlation, causing the magnitude of autocorrelation coefficients to decrease as the lag increases, resulting in $\gamma \neq 0$. Therefore, pink noise can be detected by identifying short-term correlations in the arc fault signal.

D. Pink Noise Detector

The autocorrelation function, equation (5), measures the correlation between the sampled arc fault current signal, $I_t$, against a delayed version of itself, $I_{t+k}$, where k=0, ..., K. The autocorrelation for lag, k, is as follows:

$$r_k = \frac{c_k}{c_0} \quad \text{Equation (5)}$$

where $r_k$ is the autocorrelation coefficient, $c_0$ is the sample variance of the time series and $c_k$ is defined in equation (6).

$$c_k = \frac{1}{T} \sum_{t=1}^{T-k} (I_t - \bar{I})(I_{t+k} - \bar{I}) \quad \text{Equation (6)}$$

where T is the total length of the current signal, I. The autocorrelation coefficients are calculated up to k=25. The lag and autocorrelation coefficients are analyzed on a logarithmic scale and the negative of the slope coefficient, $-\gamma$, of a simple linear fit, $\hat{r}_k$, in equation (7) is used as the decorrelation rate.

$$\hat{r}_k = -\gamma \ln k + c_1 \quad \text{Equation (7)}$$

where $c_1$ is some constant of the linear fit estimation. The decorrelation rate is a good measure of specifically determining the type of noise trend present in the PSD, providing greater detail of the kind of energy increase inside the arc fault frequency bandwidth than traditional methods that focus only on the overall increase of energy. Therefore, when the decorrelation rate increases above a certain threshold, this can be used as an indicator of pink noise, which is specific to the arc fault frequency spectrum. Switching noise and white noise will effectively be ignored, reducing the number of false alarms from noisy power electronic devices.

E. Arc Fault Detection Criteria

For proper PV arc fault detection, both the operating point detection criteria and pink noise detector must indicate the presence of a possible arc fault signature. The multi-layered detection criteria characterizes the arc fault in both the time and frequency domains as a robust method in distinguishing real arc faults from other unwanted tripping devices that only observe a single current signal (without the voltage) as an indicator for some unknown disturbance, or detects the increase in the overall noise around arcing frequencies without specific identification of pink noise behavior. The proposed detection criteria in accordance with the invention is shown in equations (8a) and (8b), which must be simultaneously satisfied for an arc fault to be detected.

$$\Delta I(t_s)<0 \& \Delta V(t_s)<0 \quad \text{Equation (8a)}$$

$$-\gamma > DR_{thresh} \quad \text{Equation (8b)}$$

where $\Delta I(t_s)$ and $\Delta V(t_s)$ are the values seen after the denoising in equations (4a) and (4b) and $DR_{thresh}$ is the pink noise detection threshold. A general flowchart of the detection algorithm 40 is shown in FIG. 3.

Figure 3:
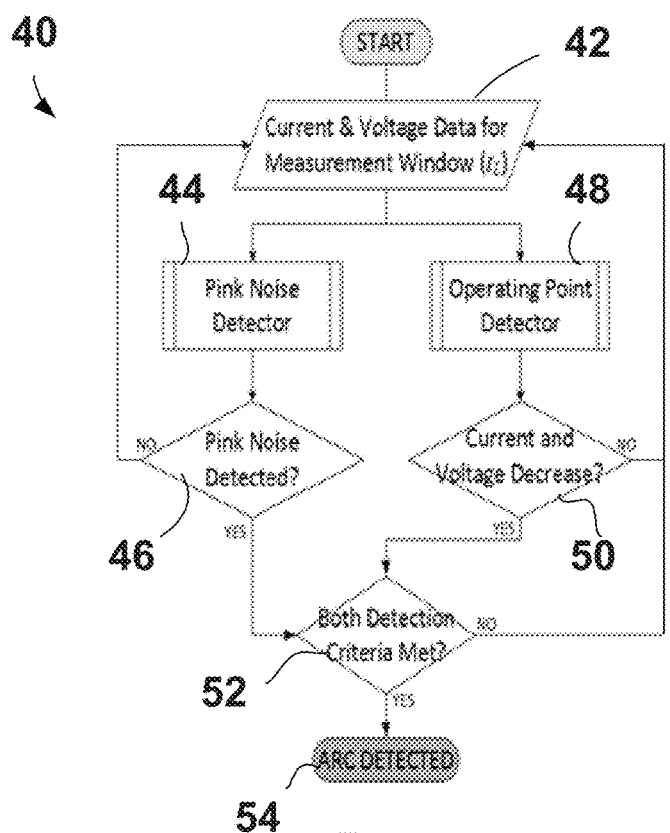
FIG. 3 illustrates a method for detecting arc faults in a PV system.

More particularly, and with reference to FIG. 3, at block 42 current and voltage measurements ae obtained by the controller 22 via the voltage sensor 12 and the current sensor 16. Once the current and voltage measurements are obtained, the method proceeds into two separate branches that, in the illustrated embodiment, are be executed simultaneously. In a first branch the voltage and current measurements are analyzed for the presence of pink noise, as indicated at block 44. Pink noise can be detected as described above with respect to equations 5-7. Next at block 46, if pink noise is not detected then an arc fault is not occurring and the method moves back to block 42 and repeats. However, if pink noise is detected the method moves to block 52 and waits for the results of the second branch. More specifically, at block 48 the voltage and current measurements are analyzed to detect the operating point of the system. The operating point may be detected as described above with respect to equations 3a-4b. If, in detecting the operating point, it is concluded that the current and voltage have not decreased, then an arc fault is not occurring and the method moves back to block 42 and repeats. If the current and voltage have decreased, then the method moves to block 52. At block 52 the results of both criteria are check and if both are not satisfied, then it is concluded an arc fault is not occurring and the method moves back to block 42. However, if both criteria re satisfied (i.e., pink noise is detected and the voltage and current have decreased), then an arc fault is detected as indicated at block 54. It is noted that while the method of FIG. 3 is shown as including two parallel branches, it will be appreciated that the method can be performed in a single "linear" path.

II. Simulation and Experimental Results

A. Simulation and Experimental Setup

Figure 4:
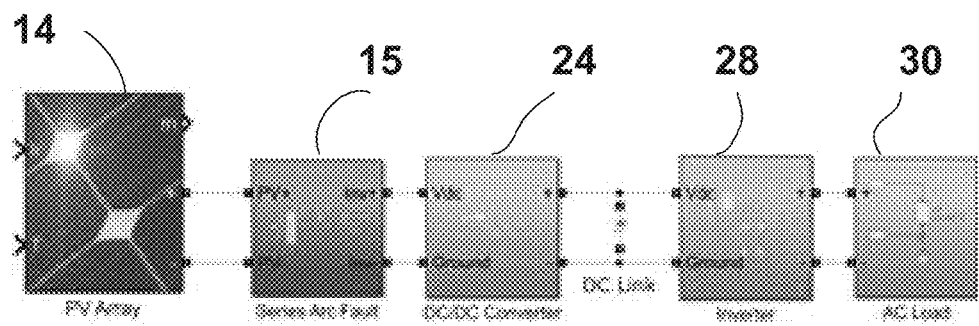
FIG. 4 is a block diagram of Simulink simulation.

An exemplary 1 kW off-grid PV system is configured with four series connected monocrystalline solar panels with a MPP voltage of 32.5 V and current of 9.24 A for a MPP of 300 W. A charge controller rated for 60 A conducts MPPT and is regulated on a nominal 48 V DC bus with lead-acid batteries fed into a rated 3 kW inverter. A block diagram of the overall simulation of the schematic shown in FIG. 2 is given in FIG. 4. As illustrated in FIG. 4, the system includes a PV array 14, a series arc fault generator 15, a DC/DC converter 24, a DC/AC converter 28 (e.g., an inverter) and a load 30. The voltage of the arcing PV string 14 is measured with a voltage divider and the DC current is measured using a hall-effect sensor. A simplified simulation of the system is conducted by replacing the charge controller with a DC/DC converter with maximum power point tracking (MPPT) and the DC link with a capacitor.

Figure 5:
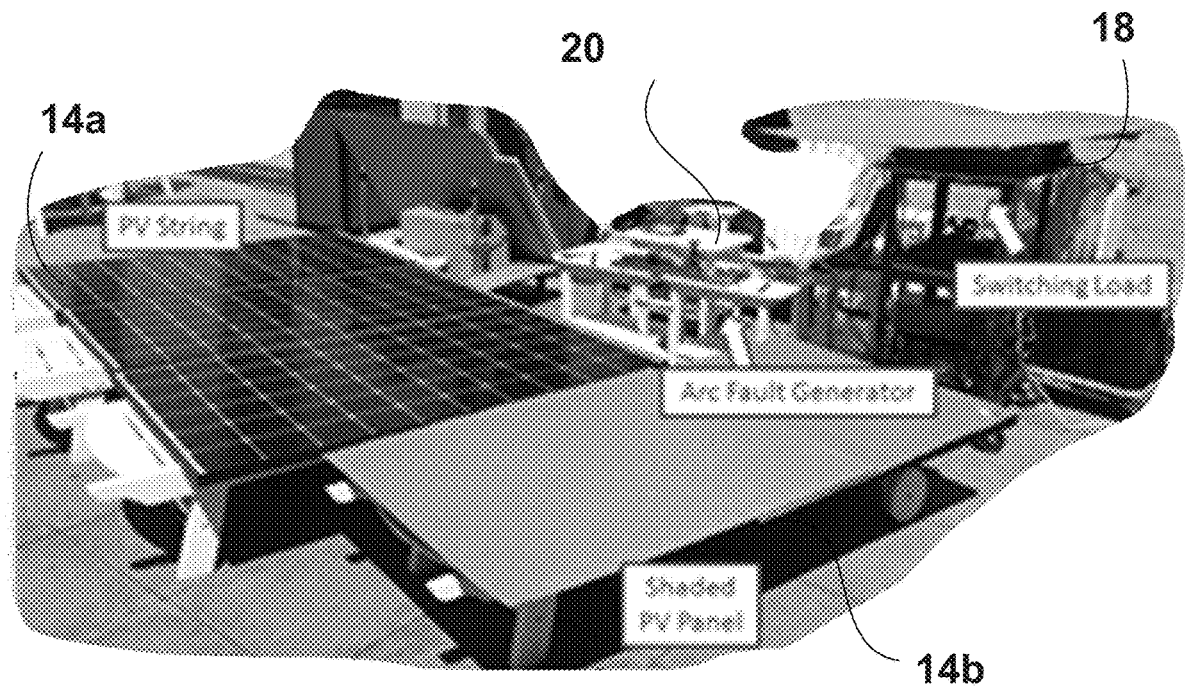
FIG. 5 illustrates an experimental PV system setup.

The switching load (defined as the load connected at the PV array) of the PV system often has a DC/DC converter for MPPT while the inverter regulates the bus at a higher voltage at 400 V or 800 V to produce an AC voltage of 120 Vrms at 60 Hz to either simulate a grid for off-grid systems or connect directly to the grid. An input capacitor or filter is seen at the input of this MPPT DC/DC converter to regulate a smooth PV voltage. A photograph of the actual experimental setup is given in FIG. 5, which includes a PV string 14a, 14b (with panel 14b shaded), arc fault detection device 20, and switching load 18.

B. Simulation Results

Figure 6:
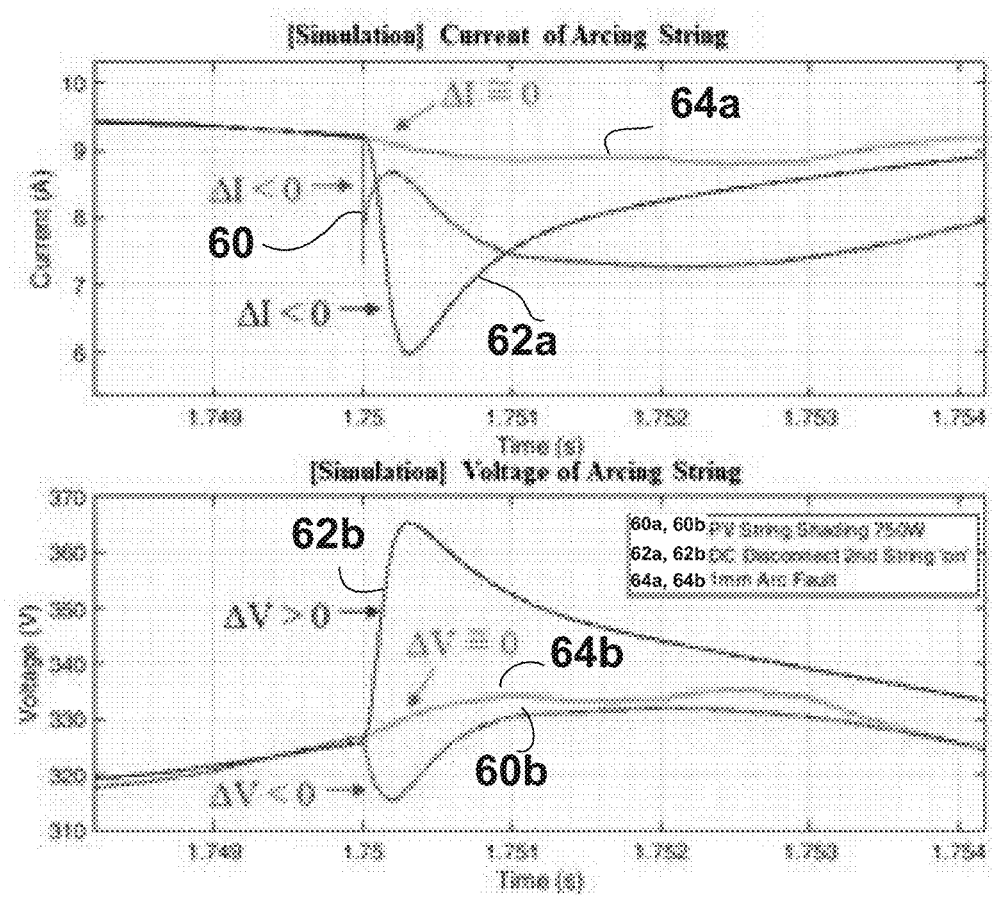
FIG. 6 illustrates simulation of arc fault, DC disconnect, and moving shadows (green) transients.

Three different PV side disturbance cases have been simulated and the operating point transient behavior is shown in FIG. 6. The three cases are as follows: 1) a series DC arc fault at the positive terminal of the first PV string 14a before a combiner box (the combiner box is where parallel strings of the PV array are joined to a single node before entering the maximum power point tracker (MPPT), $V_p$, shown in FIG. 2; 2) DC disconnect operation of the addition of second paralleled PV string 14b as seen in FIG. 2 and; 3) moving shadows across the entire PV string 14a, 14b. The non-arcing disturbance cases simulate two of the unwanted tripping loading conditions categorized under "irradiance step changes" in the PV DC arc fault circuit protection standard, UL 1699B.

As shown by Alam, Khan, Johnson and Flicker, when an arc fault 60a, 60b is initiated, there is a simultaneous decrease in the instantaneous $I_{pv\_arc}$ and $V_{load}$, as predicted by Alam, Khan, Johnson and Flicker and satisfying the operating point detection criteria of equation (8a).

DC disconnect operations 62a, 62b with fast current transients have been seen to also cause false alarms. In FIG. 6, new PV string is added to an existing PV array, injecting additional power to the PV side of the system as a current source. There is no arcing gap and $V_{arc}=0$. The power demand of the switching load remains constant because the MPPT operates at a longer time scale than the transient period. Therefore, $C_{in}$ absorbs the extra current to keep $I_{load}$ constant, increasing $V_{load}$. The inverse current and voltage transient behavior does not satisfy equation (8a) and does not represent an arc fault signature.

The moving shadows case 64a, 64b change the operating point with an inverse current and voltage behavior, similar to the DC disconnect case, following the PV I-V curve. However, the change occurs over longer periods of time compared to arc faults and satisfies equations (4a) and (4b) and, thus, can be ignored and assumed to be zero. Therefore, the operating point detection criteria of equation (8a) is not satisfied, and a potential arc fault signature is not detected.

C. Experimental Results

Figure 7:
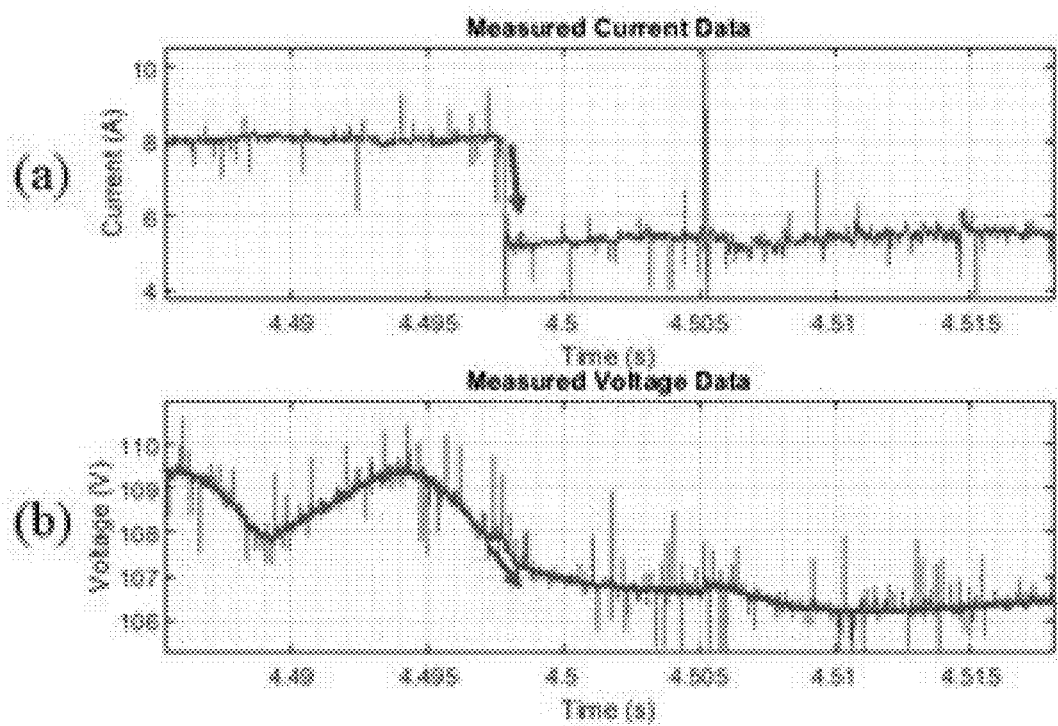
FIG. 7 illustrates (a) Measured PV string current signal and (b) voltage signal.

In FIG. 7, an arc fault is initiated at 4.498 seconds (see arrow in FIG. 7). When the arc fault is initiated, the current signal in FIG. 7a and voltage signal in FIG. 7b show a simultaneous decrease in magnitude. Therefore, the operation point detection criteria described by equation (8a) is satisfied.

Figure 8:
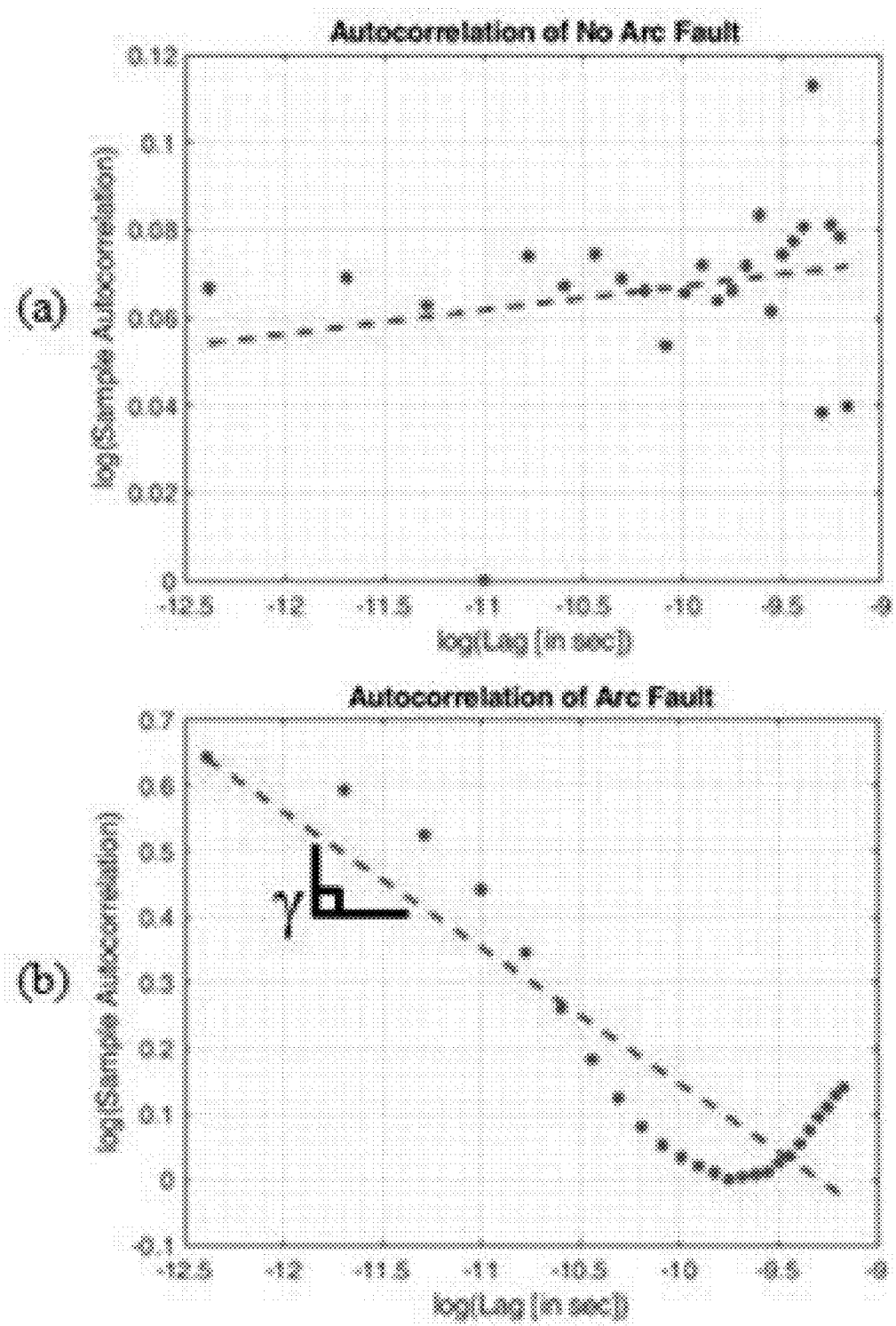
FIG. 8 illustrates linear fit of the autocorrelation of (a) no arc fault case and (b) arc fault case of the PV string current.

In FIG. 8a, the autocorrelation without an arc fault present is calculated for a 10 ms window and a maximum lag of 100 µs for a PV system with switching noise and no arc fault. The decorrelation rate, $\gamma$, is 5.46e-3 with an R-squared ($R^2$) of 0.05 R-squared is a statistical measure of variance for a dependent variable explained by a collection of independent variables. In the present example, the decorrelation rate is dependent on the noise on the PV system. R-squared is given from 0 to 1, and a larger R-squared means a more likely fit. For example, with a decorrelation rate of 5.46e-3 and an R-squared of 0.05, R-squared (i.e., 0.05) is much less than 1 and therefore, even though the decorrelation rate was calculated the fit is poor and the data can be considered random. In contrast, if R-squared is closer to 1 then the decorrelation rate can be considered a much better fit. Therefore, although the slope is positive (which is not likely in autocorrelation), the fit is relatively bad indicating a random process. The threshold for detection, $DR_{thresh}$, is set at 0.08 to ignore this "no arc fault" case, satisfying the pink noise condition in equation (8b). The decorrelation rate can be assumed to be near zero and unchanging, revealing a dominant presence of white noise or switching noise.

When an arc fault is initiated, pink noise is injected into the system. In FIG. 8b, the decorrelation rate is calculated to be $\gamma=-0.207$, which is about two orders of magnitude greater than the "no arc fault" case above, with an $R^2$ of 0.79, indicating that the decorrelation rate slope is statistically significant. Therefore, a negative sloping autocorrelation is detected showing LRD and the presence of pink noise, violating the $DR_{thresh}$, and satisfying the detection criteria of an arc fault in equation (8b).

Figure 9:
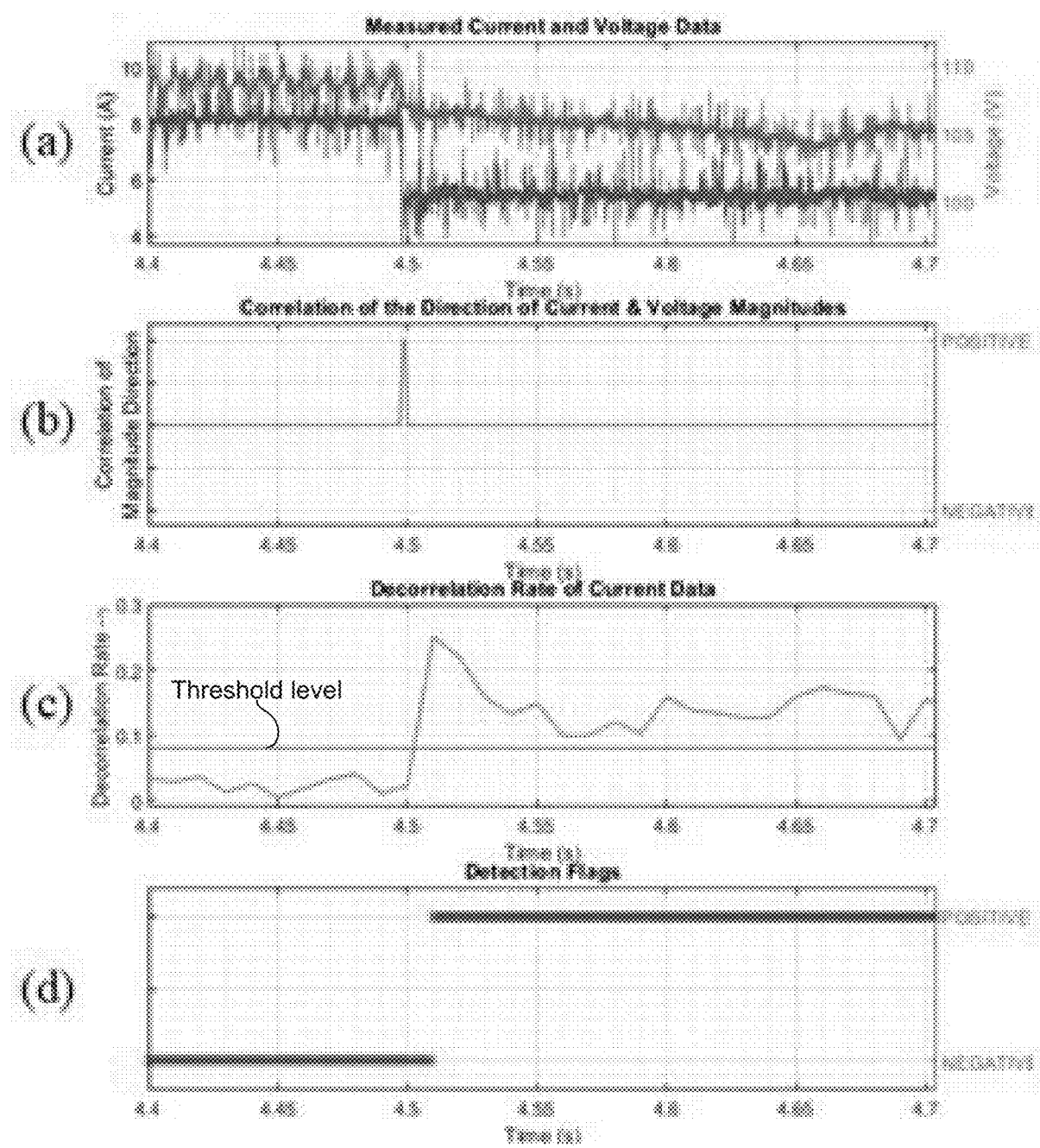
FIG. 9. illustrates (a) Measured PV current and voltage data analyzed for (b) a decrease in both current and voltage magnitude and (c) an increase in decorrelation rate to (d) detect an arc fault.

FIG. 9 visualizes the exemplary arc fault detection algorithm. FIG. 9a is the zoomed out current and voltage signal with an arc fault as seen in FIG. 8b. FIG. 9b indicates the detection of a simultaneous decrease in the instantaneous current and voltage signals leading to a positive detection of a possible arc fault signature (a positive correlation). FIG. 9c shows the increase of the decorrelation rate, breaking the threshold, and satisfying pink detection criteria in equation (8b). Therefore, the operating point detection criteria is satisfied and the presence of pink noise is confirmed, triggering the arc fault detection flag as seen in FIG. 9d.

The method for detecting series DC arc faults in accordance with the invention uses a combination of the operating point behavior of a PV string during the initiation of an arc fault and the specific characterization of pink noise generated by an arc fault. The magnitude of the instantaneous current and voltage of a PV string both decrease at the initiation of an arc fault, unlike partial shading or DC disconnect operations. The decorrelation rate differentiates energy increases in the arc fault frequency bandwidth by identifying the pink noise signature and ignoring white noise or switching noise, unlike traditional algorithms that observe only an overall increase in energy. The combination of the arc fault features in the time domain and frequency domain creates a unique arc fault profile reducing the detector's susceptibility to false alarms.

In accordance with another aspect of the invention, arc faults generate pink noise that increases the RS Coefficient when ignited and during stable arcing. Further, and as discussed herein, arc faults decrease the current magnitude and voltage magnitude generating a positive magnitude change relationship. These characteristics of arc faults can be utilized to detect the occurrence of an arc fault. Other noise disturbances from, for example, an inverter is considered load side noise which have a current decrease and voltage increase or vice-versa characteristic which is a negative magnitude change relationship.

The RS coefficient refers to rescaled range coefficient, and a method 70 of calculating the RS coefficient is illustrated in FIGS. 10A, with further detail in FIG. 10B. More particularly, and referring to FIG. 10A, at block 72 a series of data (voltage and current measurements) are acquired, and at block 74 the minimum subdivision length "n" is determined (the number "n" is arbitrarily small to enable small sections of the series of measured data to be seen; if the number "n" is made too small then there may not be enough data points to generate a significant cumulative sum). Next at block 76, the acquired series of data is subdivided into "m" sections each having a length of "n" (e.g., m is obtained by dividing the length of the measured data by n). The method then proceeds into two parallel paths. In a first path the mean of each subdivision is calculated as indicated at block 78. Then at block 80, the calculated mean is subtracted from each acquired data point (thereby creating a zero-mean data), and at block 82 the cumulative sum of each subdivision (i.e., after subtracting the mean from each data point) is determined. Then at block 84, the range (max and min) of each cumulative subdivision "m" is found. Also, at block 86, which is in parallel with blocks 78-84, an unbiased standard deviation is calculated as is a rescaled range (which is the calculated range of each cumulative subdivision "m" divided by the standard deviation of that subdivision "m"). As is known, an unbiased standard deviation is a term of art that refers to a standard deviation calculation performed with n−1 instead of n. Blocks 84 and 86 then move to block 88, where a rescaled range of each subdivision is calculated using the cumulative sum calculations from the first parallel branch and dividing by the unbiased standard deviation calculation of the second parallel branch. At block 90 the average of the rescaled range is calculated to provide the value used to determine pink noise.

Optionally, further refinement can be performed as indicated at optional blocks 92-96. More specifically, at block 92 it can be determined if the subdivision length can be increased. For example, if there is still a divisible integer value for the length of the entire measured data set higher than the "n" just used, then the subdivision length can be increased (if the entire measured data has a length of 2400, and n=800, the subdivision can be increased to n=1200, but not to the boundary condition of n=2400). If the subdivision length cannot be increased, the method moves to block 94 where a linear slope of the log rescaled range is calculated by log subdivision length plot. However, if the length can be increased, the method moves to block 96 where the length "n" is increased, and then the method moves back to block 76 and repeats.

Accordingly, to obtain the RS coefficient, a sweep is performed through all the subdivisions in the current signal and each rescaled range value is calculated and averaged. FIG. 10B provides additional detail with respect to the calculations performed in the method of FIG. 10A.

Figure 11:
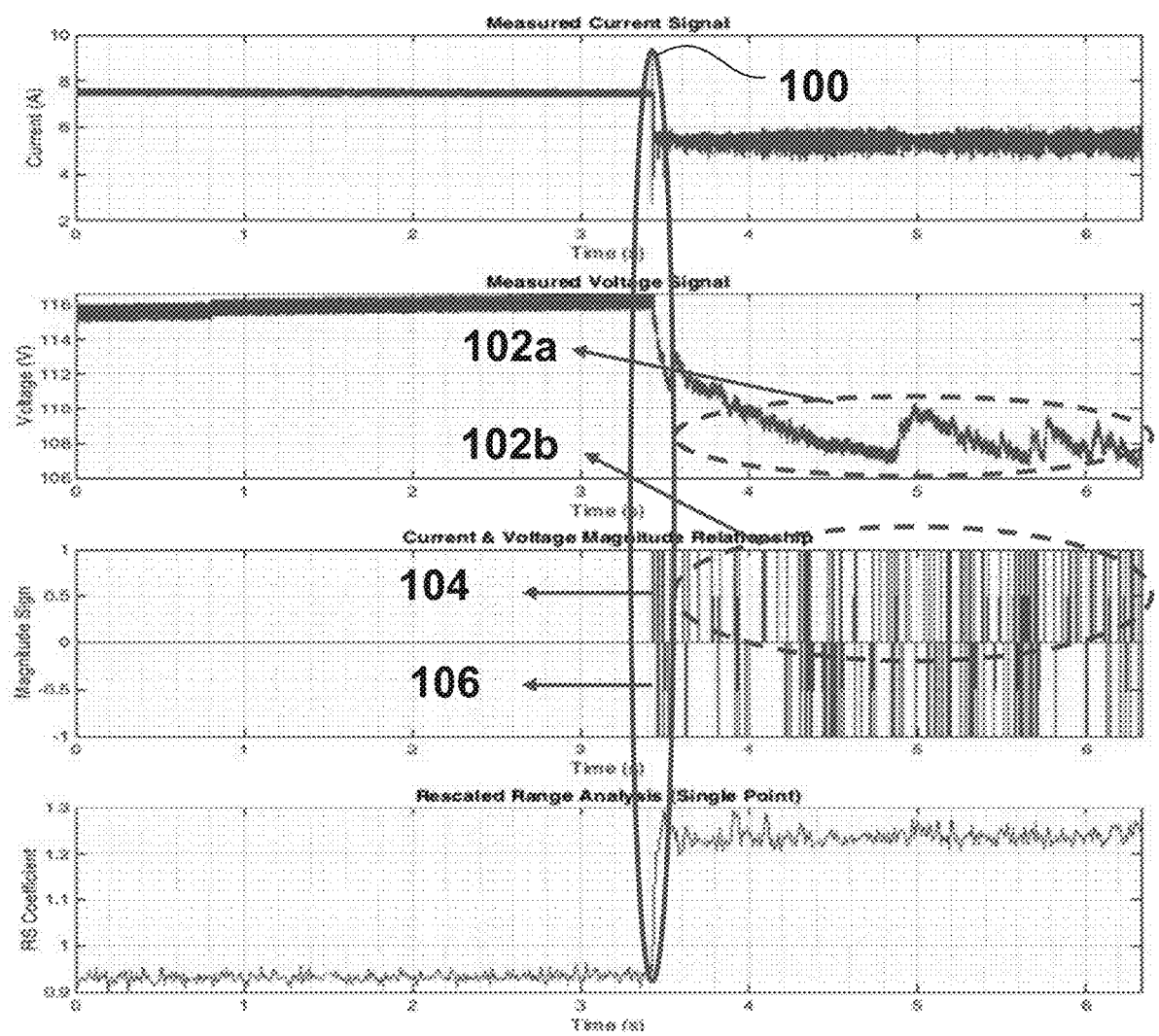
FIG. 11 illustrates graphical data for a PV system with a resistive load undergoing an arc fault.

Referring now to FIG. 11, illustrated are actual test results for a PV system with a resistive load undergoing an arc fault. As can be seen in FIG. 11, when the arc fault is initiated as shown in region 100, the magnitude of the current and voltage decreases. When the current and voltage magnitude drop in the same direction, this correlates to a positive relationship. The regions 102a, 102b illustrate additional ignition-like events that are related to the volatility of the arc fault in air. Further, region 104 illustrates a positive relationship between current and voltage at the point of ignition, while region 106 illustrates negative relationship between current and voltage after ignition. This negative relationship relates to the reaction of the load to the arc fault. The arc fault also generates a pink noise frequency spectrum, increasing the RS.

Figure 12:
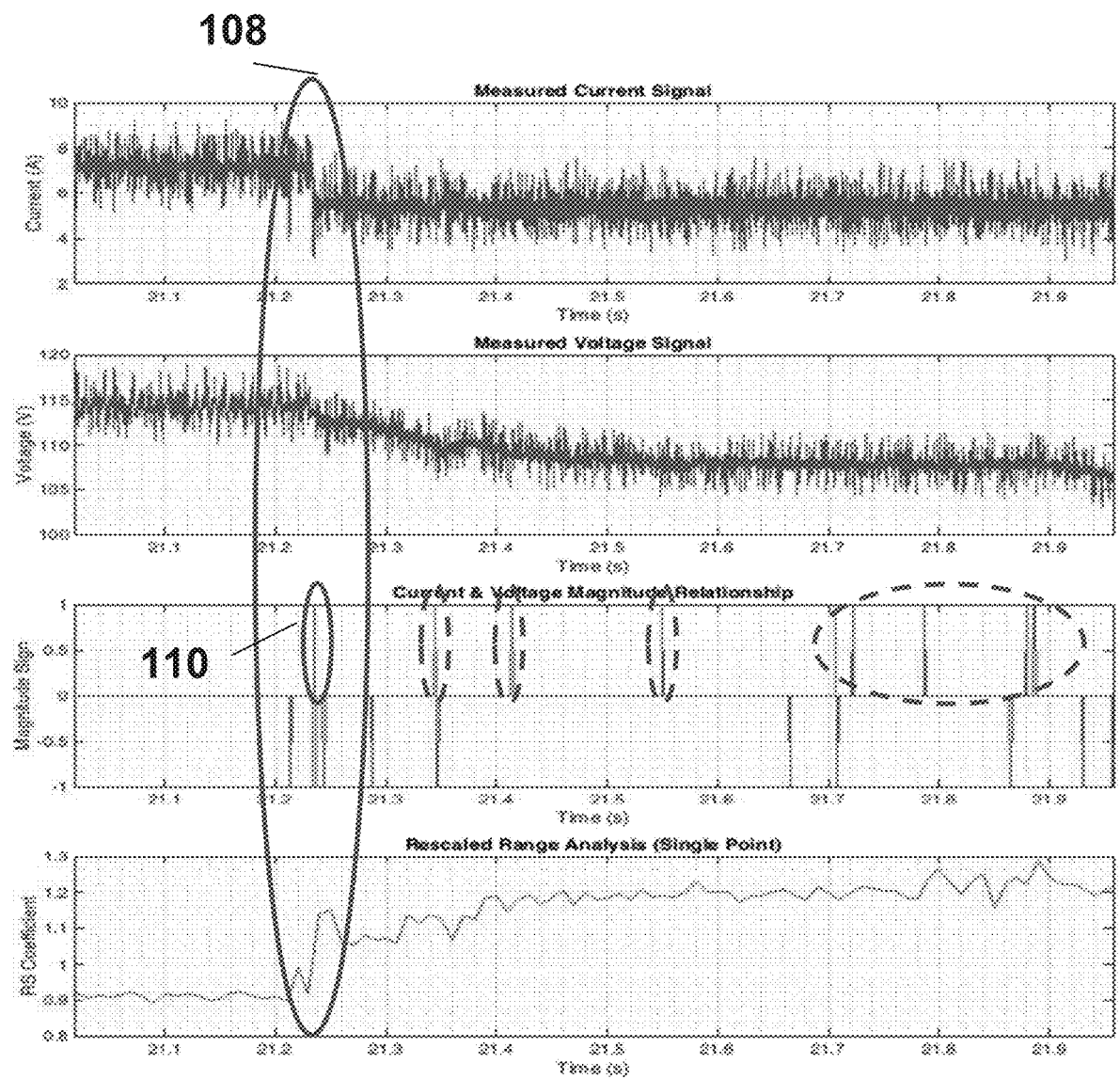
FIG. 12 illustrates graphical data for a PV system with an inverter load undergoing an arc fault.

Moving to FIG. 12, illustrated are actual test results for a PV system with an inverter load undergoing an arc fault. When the arc fault initially occurs there is a sharp transient corresponding to a drop in the voltage and current magnitudes, as shown in region 108. At the moment of the arc fault there is a positive current and voltage magnitude relationship spike (region 110). The ignition event is coupled with an increase in the RS Coefficient representing the added pink noise to the system. Additional events also occur as shown in the dashed regions.

One issue that needs to be addressed is false tripping. FIGS. 13-16 illustrate waveforms of a PV system, and specifically false trip scenarios.

Figure 13:
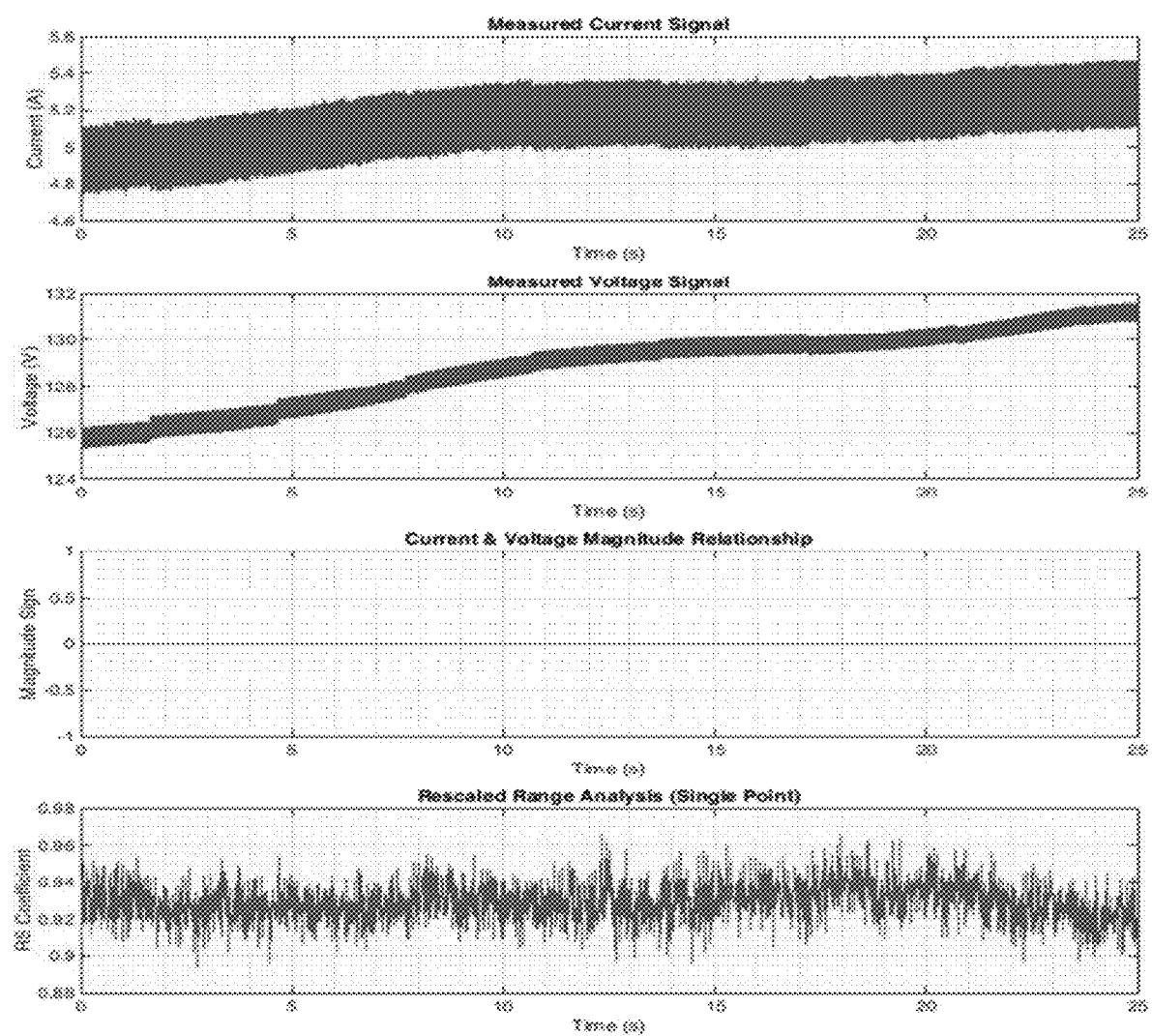
FIG. 13 illustrates graphical data for a PV system with a resistive load under cloudy conditions.

Referring to FIG. 13, illustrated are current, voltage, magnitude sign and RS coefficient for a PV array with a resistive load under cloudy conditions. As can be seen in FIG. 13, over the long term, the current and voltage signals both increase showing a positive relationship. However, arc faults have a decreasing current and voltage magnitude so no positive correlation is shown. There is no added noise from a moving cloud. Therefore, the RS Coefficient remains relatively constant and thus an arc fault has not occurred.

Figure 14:
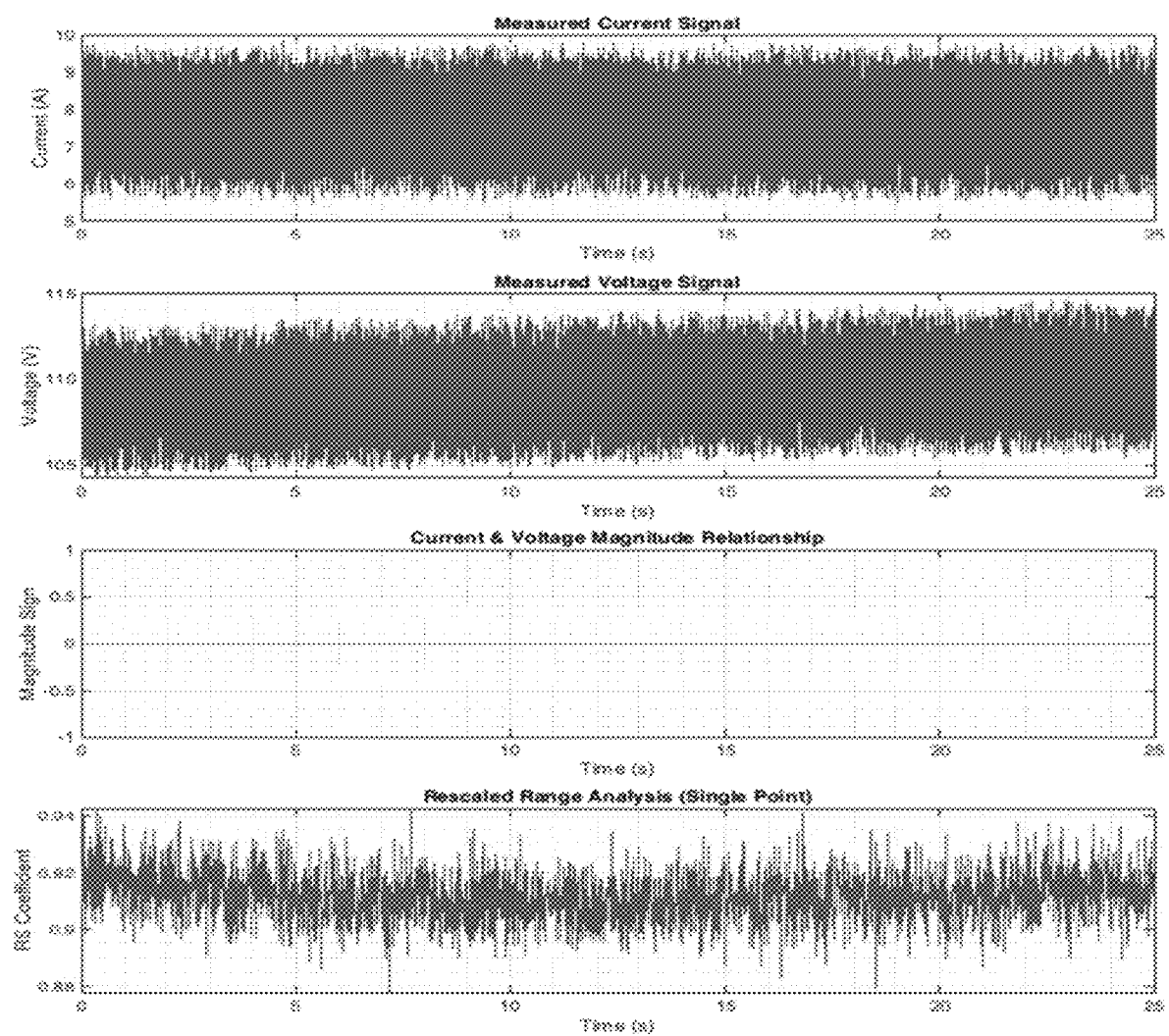
FIG. 14 illustrates graphical data for a PV system with an inverter load.

Referring to FIG. 14, illustrated are current, voltage, magnitude sign and RS coefficient for a PV array with an inverter load. As can be seen in FIG. 14, over the long term the current and voltage signals both increase showing a positive relationship, as seen in the first two charts of FIG. 14. However, from the third chart it can be seen there is no observable change in the current and voltage magnitude (and thus no arc fault), while the inverter noise generates a relatively constant RS Coefficient.

Figure 15:
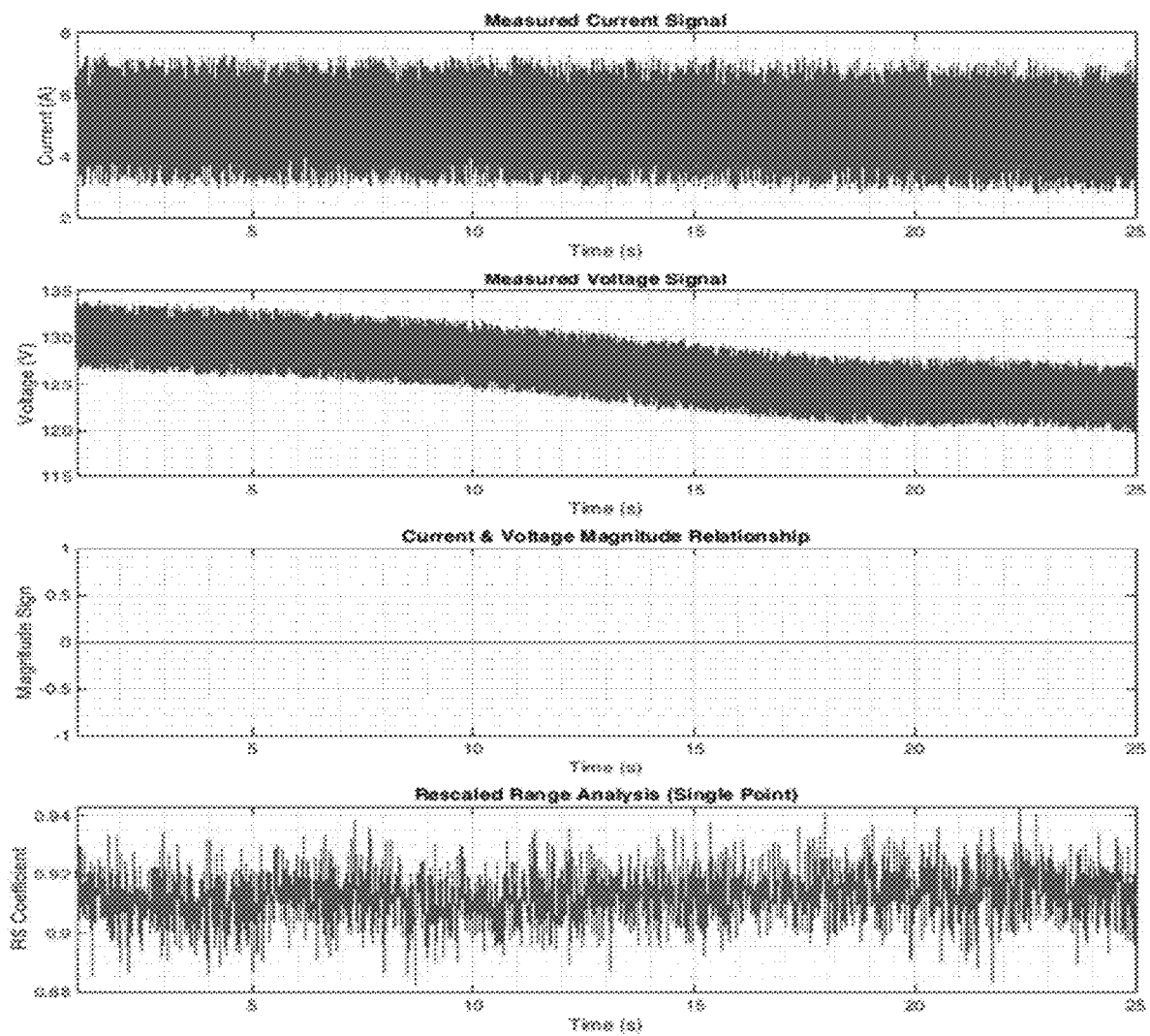
FIG. 15 illustrates graphical data for a PV system with an inverter load under cloudy conditions.
Figure 16:
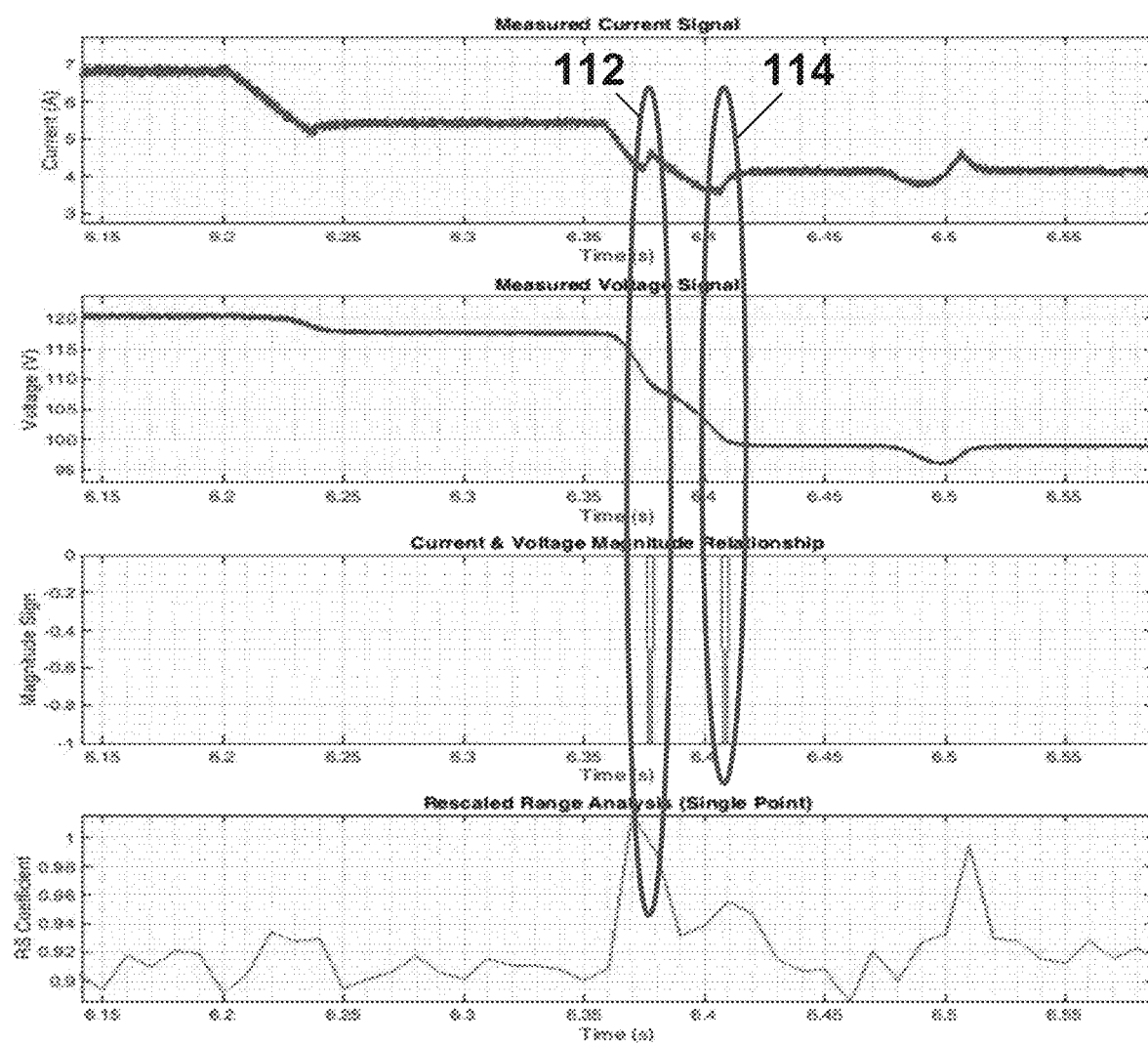
FIG. 16 illustrates graphical data for a PV system with a resistive load under moving shadows.

With respect to FIG. 15, the data is captured under cloudy conditions, thereby affecting PV power generations. In cloudy conditions with an inverter load, there is no fast acting current and voltage transient, as evidenced by the first two charts. Additionally, no change in the current and voltage magnitude is observed, while the RS Coefficient remains relatively constant because there is no additional noise added to the system. Accordingly, an arc fault has not occurred Moving now to FIGS. 16-17, the same PV system is shown wherein the PV system is coupled to a resistive load (FIG. 16) and an inverter load (FIG. 17) and in an environment with moving shadows (e.g., partly cloudy/partly sunny skies). Referring to FIG. 16, under moving shadows the PV panels generally react with a positive relationship. However, negative relationship moments are observed, see regions 112 and 114. The negative moments are seen in to correspond to some additional noise added to the system from the load side or from the way other PV panels in the same string interact with each other.

Figure 17:
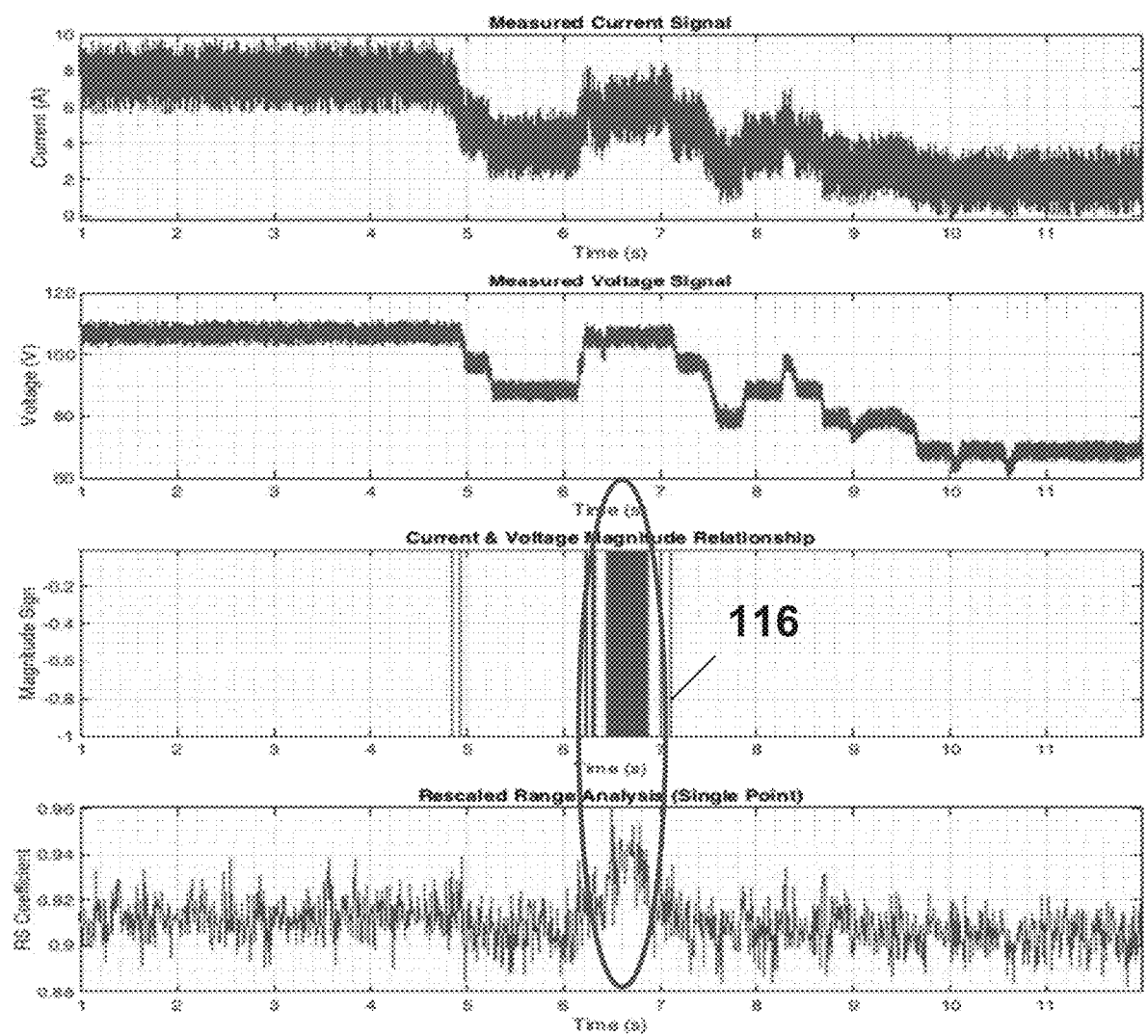
FIG. 17 illustrates graphical data for a PV system with an inverter load under moving shadows.

Referring to FIG. 17, when a shadow moves across the PV string, there is generally a positive relationship where an increase in the current results in an increase in the voltage. However, for unknown reasons negative relationship moments are observed (see region 116). The negative relationships is coupled with some added noise to the system that is not due to an arc.

Figure 18:
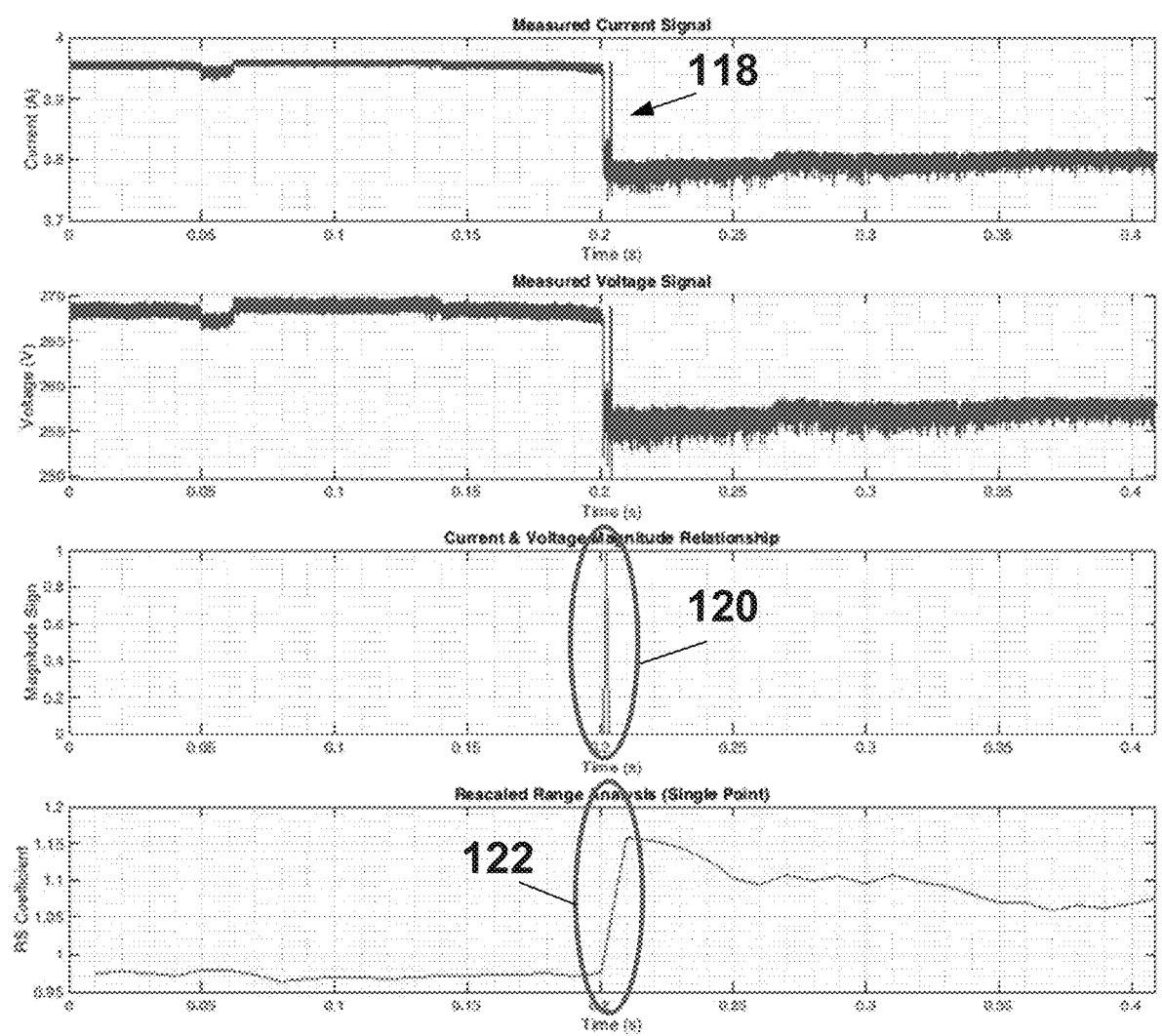
FIG. 18 illustrates graphical data for a PV system with a resistive load undergoing an arc fault.
Figure 19:
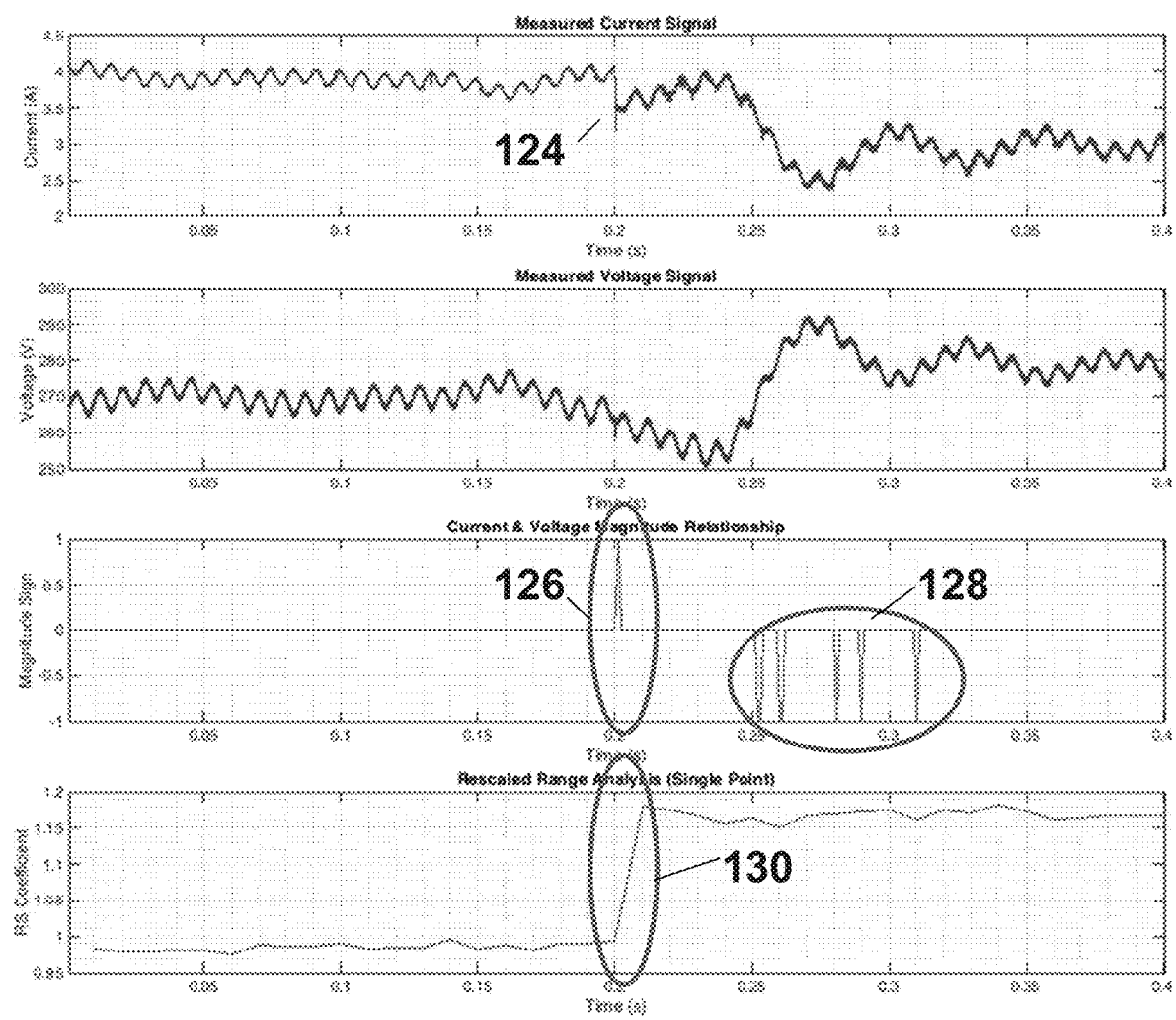
FIG. 19 illustrates graphical data for a PV system with an inverter load undergoing an arc fault.
Figure 20:
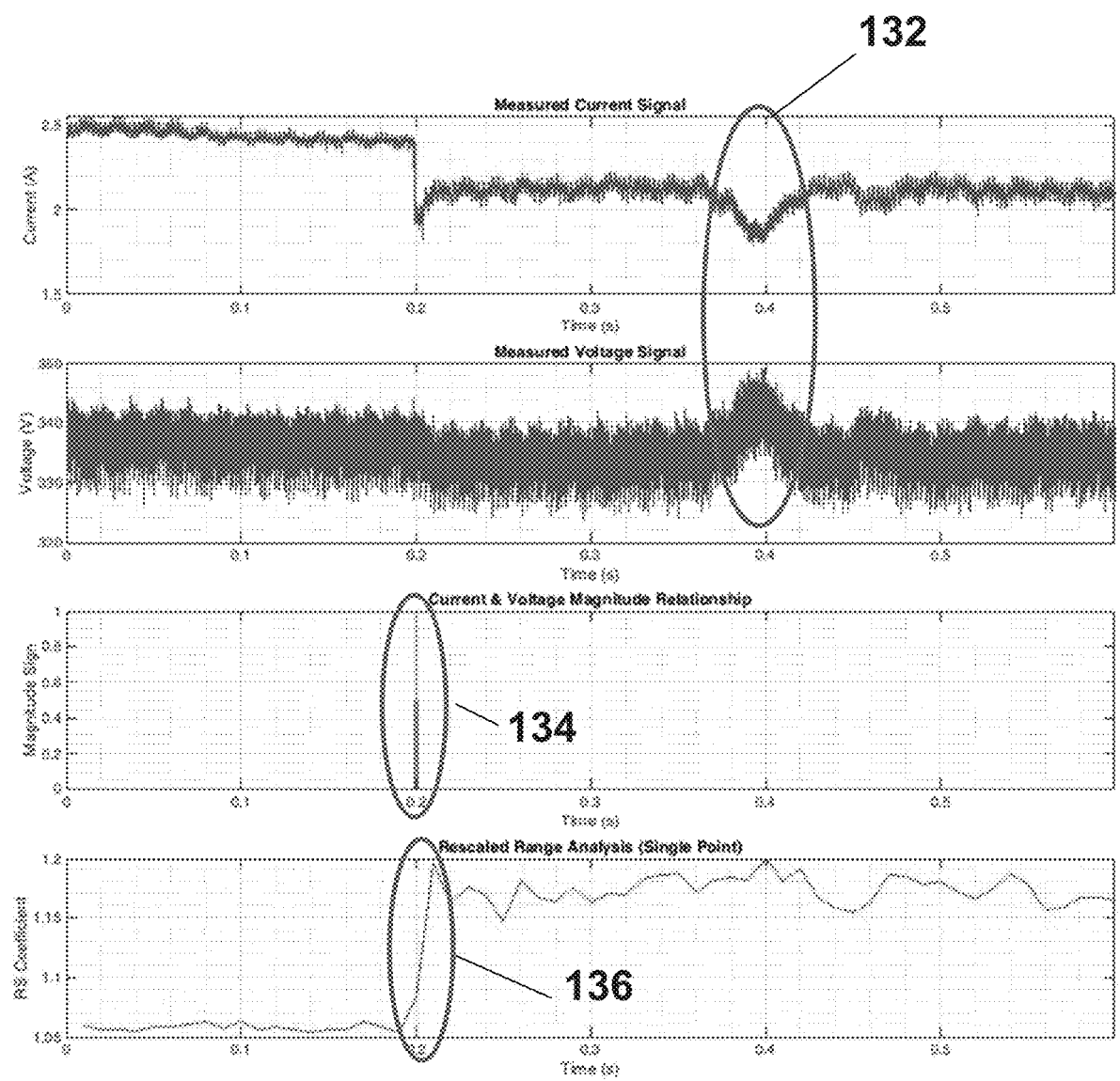
FIG. 20 illustrates graphical data for a PV system with a 3-phase inverter load undergoing an arc fault.

FIGS. 18-20 illustrate successful detection of arc faults for different loads. Specifically, FIG. 18 illustrates an arc fault for PV system with a resistive load. As shown in FIG. 18, when the series arc fault occurs (region 118) the added impedance of the arc fault creates a voltage drop decreasing the measured voltage at the load and decreasing the current magnitude, and the magnitude of the current and voltage change in the same direction (region 120), indicating a change at the source. The arc fault adds a pink noise that increases the RS Coefficient (region 122).

FIG. 19 illustrates arc fault data for a PV system with an inverter load. In the presence of an inverter the current magnitude still drops during an arc fault (region 124). The voltage also shows a transient with a magnitude drop at the ignition of the arc fault (region 126). Additionally, there is a positive response because the current and voltage react in the same way during an arc ignition. However, any other noise and transient in the system has a negative response (region 128) indicating noise from the load. Pink noise of the arc fault increases RS Coefficient (region 130).

FIG. 20 illustrates arc fault data for a PC system and a 3-phase inverter load. Large low-frequency changes in the load show a negative correlation (current decreases while the voltage increases—region 132). The algorithm can successfully detect an arc fault with a 3-phase inverter just as seen in the resistive load and single phase inverter cases (see regions 134 and 136).

Figure 21:
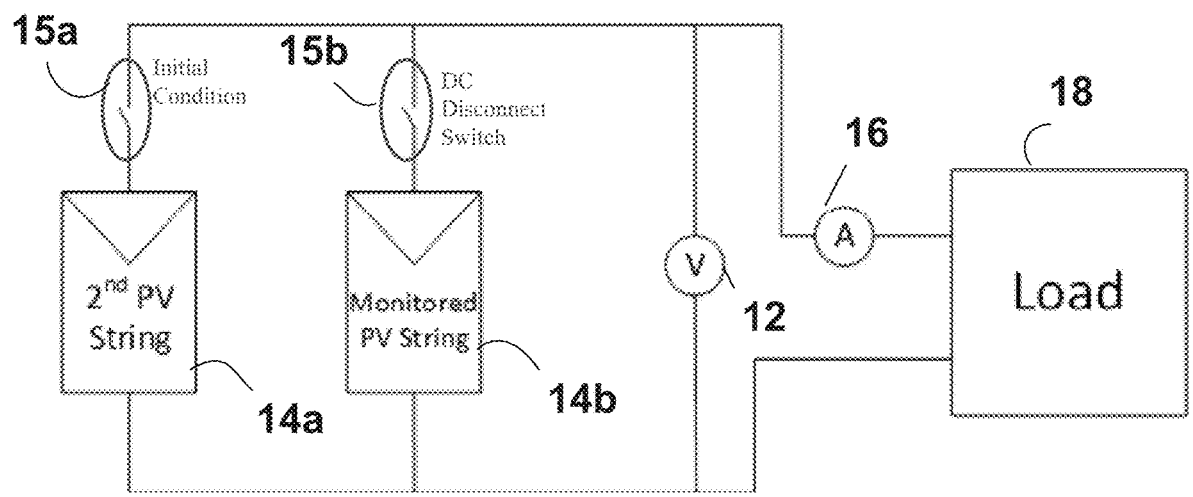
FIG. 21 is a schematic diagram of a PV system used for illustrating false trip avoidance.

The arc fault detection methodology in accordance with the invention is also immune to false trips within the system. As discussed in more detail below, FIGS. 22-25 show data for various configurations of the system of FIG. 21. The exemplary system of FIG. 21 includes a monitored PV string 14b and a second PV string 14a connected in parallel with the monitored PV string, the parallel combination powering a load 18, with voltage and current measurement devices 12, 16 measuring the voltage and current provided to the load 18. The PC strings 14a, 14b can be selectively connected and disconnected from the load by switches 15a, 15b, respectively.

Figure 22:
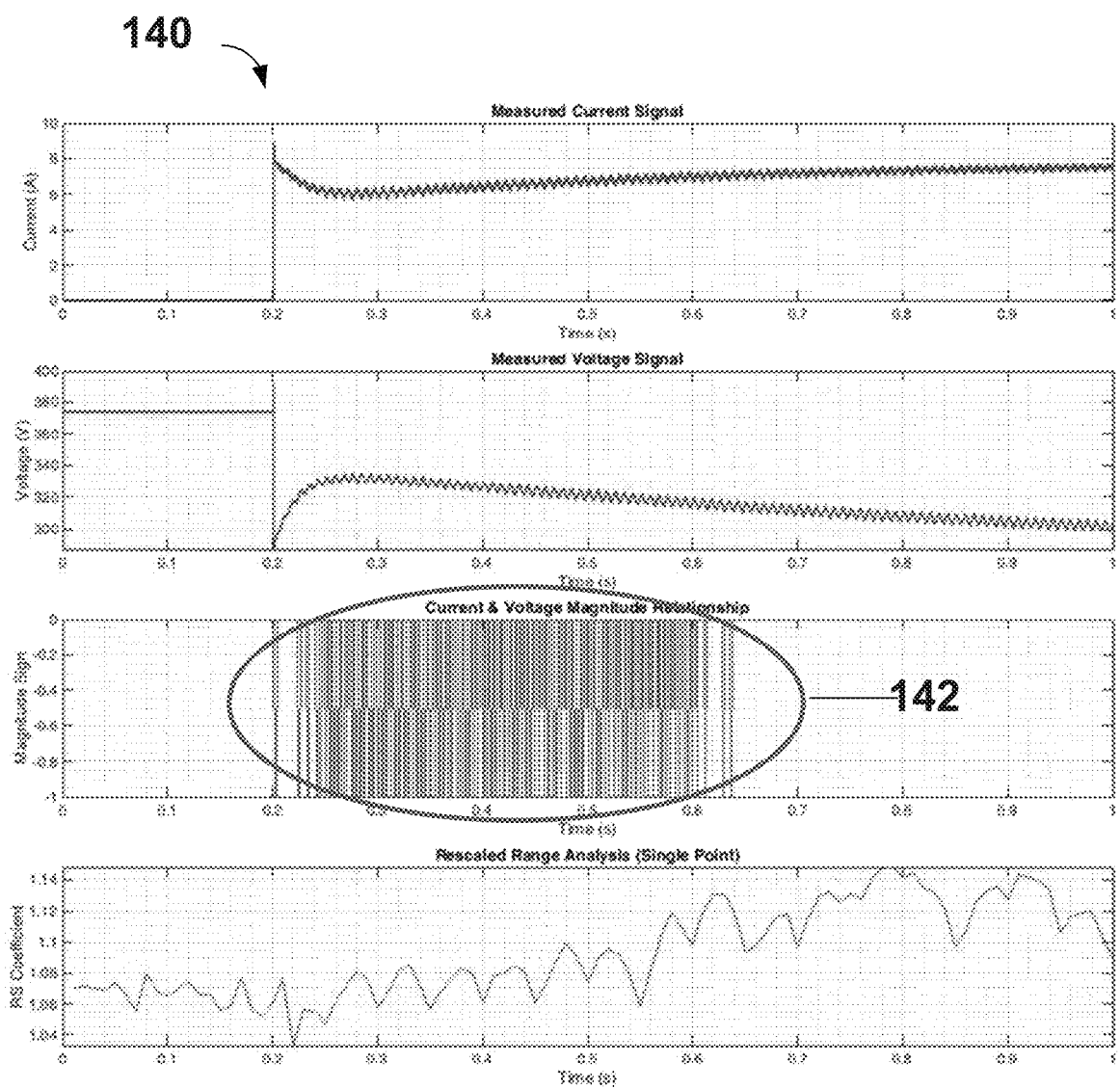
FIGS. 22-25 illustrate graphical data for the PV system of FIG. 21 under various configurations.

FIG. 22 illustrates the monitored PV string 14b being connected, while the second PV string 14a remains disconnected. When the monitored PV string 14b is turned "on" and connected to a load (e.g., by closing the DC disconnect switch 15b), there is an increase in the current draw and the open circuit voltage drops to the operating voltage (see region 140). A negative correlation is produced in region 142 that indicates a change in the load side (the PV string sees no load and then suddenly sees a load connected), which is due to load noise. Further, there is a gradual increase in the RS Coefficient attributed to the start-up of the system. However, the increase is not a short transient as seen in arc faults. In this configuration a false trip is successfully avoided.

Figure 23:
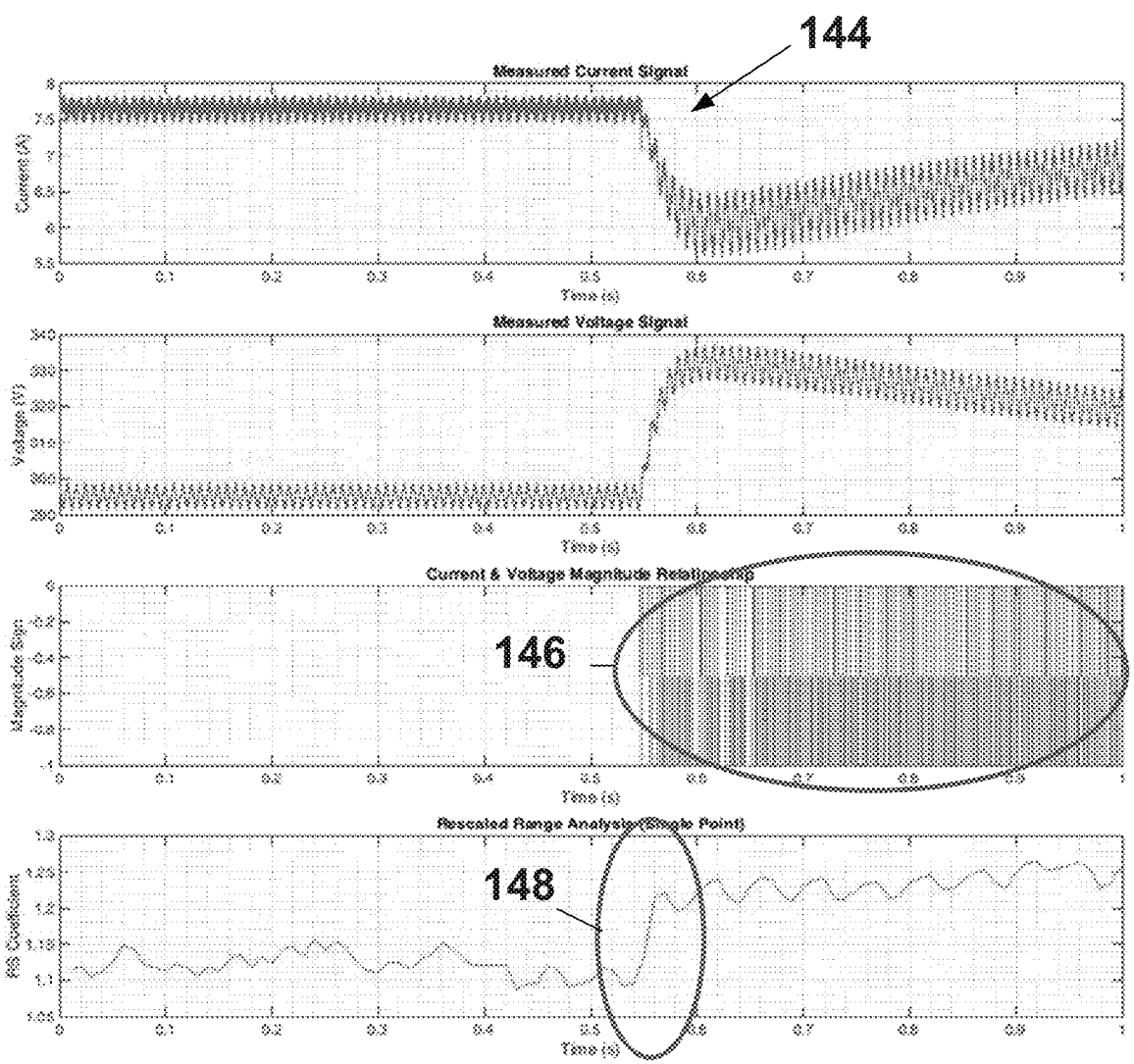

FIG. 23 illustrates connecting the monitored PV string 14b with the second PV string 14a already connected. When the monitored PV string 14b is turned "on" and connected to the load, the current draw decreases as seen in region 144. The monitored PV string 14b, in this case, pulls up the voltage of the entire PV array. This a negative correlation indicating a change in the load side (the PV string 14b sees no load and then suddenly sees a load (load noise) connected—see region 146.) The monitored PV string 14b that is connected introduces extra noise, which increases the RS Coefficient baseline, as seen in region 148. This increase in the RS coefficient, however, is insufficient to trigger an arc fault. In this configuration a false trip is successfully avoided.

Figure 24:
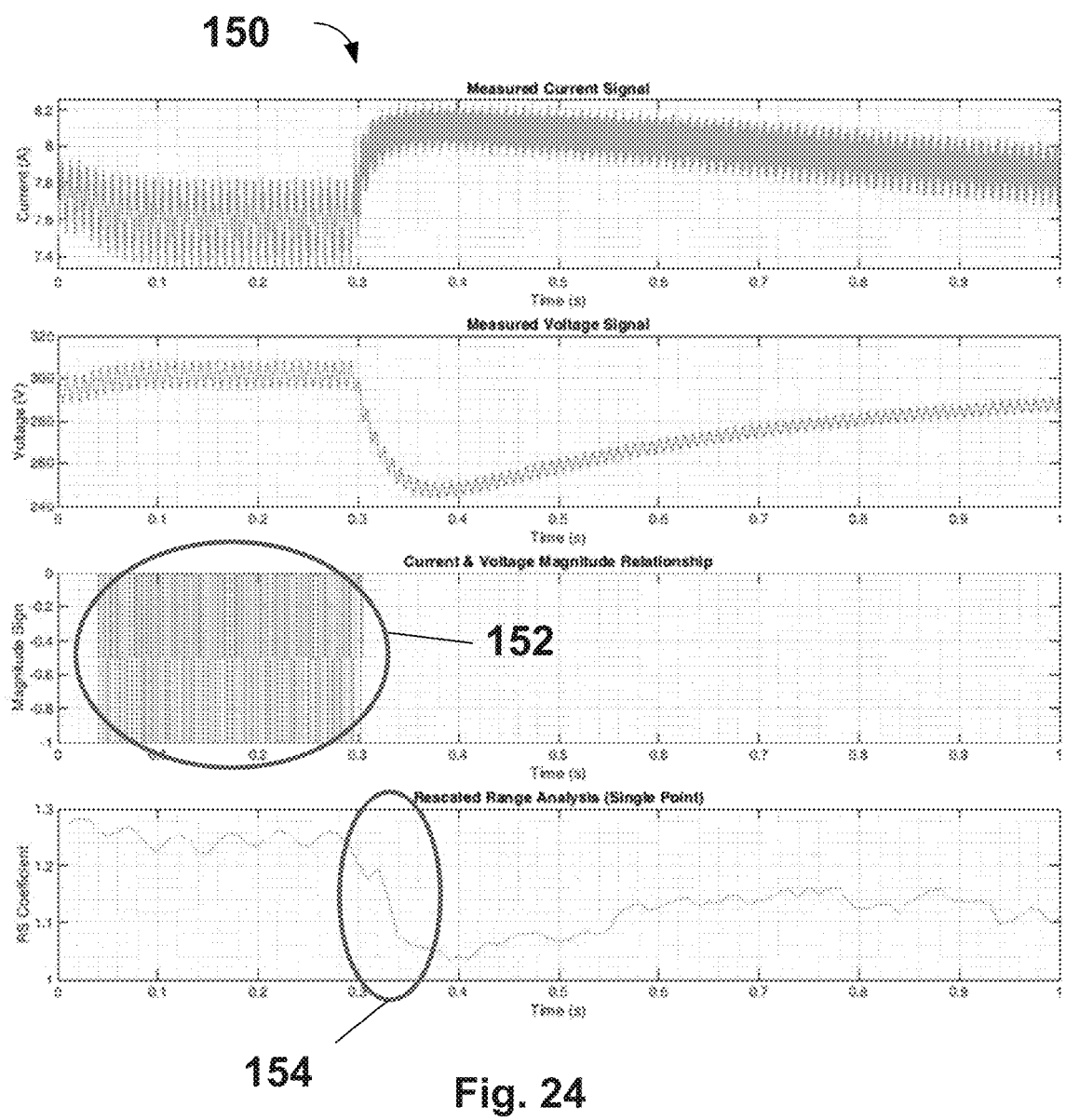

FIG. 24 illustrates disconnecting the monitored PV string 14b while the second PV string 14a is connected. When the monitored PV string 14b is turned "off" while connected to a load 18, the current draw increases as seen in region 150. The DC voltage bus is pulled down when the second PV string 14a is disconnected. This a negative correlation (region 152) indicating a change in the load side and is due to load noise. Further, the RS Coefficient baseline decreases when the extra noise from the second PV string 14a is disconnected, as seen in region 154. While the RS Coefficient decreases, the decrease is insufficient to trigger an arc fault. In this configuration a false trip is successfully avoided.

Figure 25:
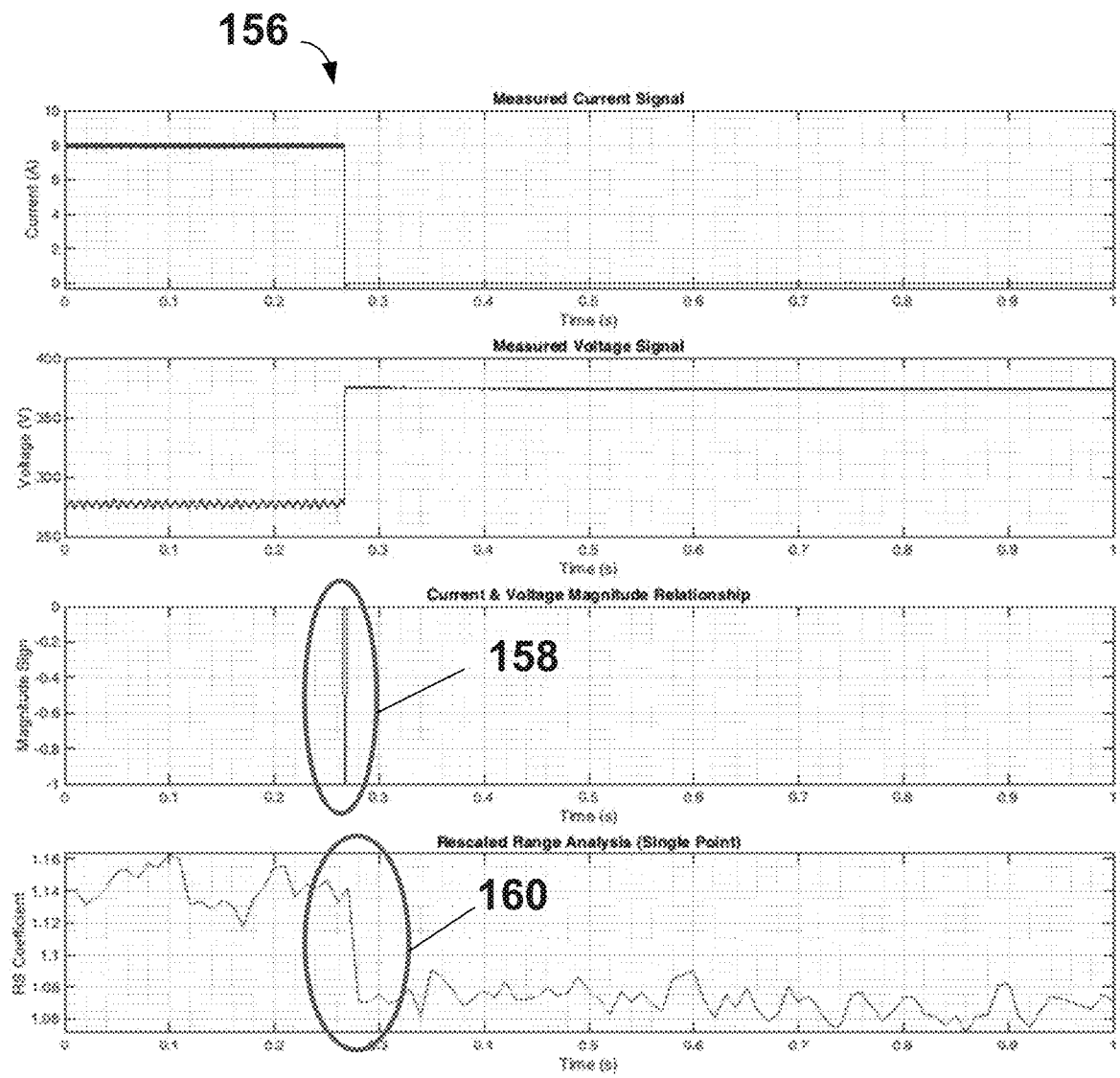

FIG. 25 illustrates disconnecting the monitored PV string 14b when the second PV string 14a is disconnected. When the monitored PV string 14b is turned "off" and disconnected from the load 18, no more power is supplied. The voltage of the string is open circuited causing current to drop to 0 and voltage to rise to rated voltage (region 156). This causes a negative correlation indicating a change in the load side due to load noise (region 158). The RS Coefficient baseline decreases when the extra noise from the load is disconnected (region 160). While the RS Coefficient decreases, the decrease is insufficient to trigger an arc fault. In this configuration a false trip is successfully avoided.

Modifications and alterations of the structures shown in the drawings will become apparent to those skilled in the art after reading the present specification. It is intended that all such modifications and all variations being included in so far as they come within the scope of the patent as claimed or the equivalence thereof.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

What is claimed is:

1. A method for detecting arc faults in a photovoltaic (PV) string connected to a load, wherein a voltage sensor and a current sensor are electrically connected to the PV string and operative to measure a voltage and current, respectively, supplied to the load, the method comprising:
    measuring, using the voltage sensor, a voltage output by the PV string over a prescribed time period to obtain a data set of voltage measurements;
    measuring, using the current sensor, a current output by the PV string over the prescribed time period to obtain a data set of current measurements;
    determining if the data set of voltage measurements and the data set of current measurements are simultaneously decreasing within the prescribed time period;
    using a pink noise detector to analyze the data set of current measurements and the data set of voltage measurements for the presence of pink noise within the prescribed time period; and
    concluding an arc fault has occurred when
        i) the pink noise detector indicates pink noise is present during the prescribed time period, and
        ii) at least a portion of the data set of voltage measurements and at least a portion of the data set of current measurements are simultaneously decreasing while pink noise is present.

2. The method according to claim 1, wherein analyzing the data set of current measurements and the data set of voltage measurements for the presence of pink noise comprises:
    obtaining from the data set of voltage measurements and the data set of current measurements a plurality of autocorrelation coefficients;
    analyzing the plurality of autocorrelation coefficients to obtain a decorrelation rate; and
    concluding pink noise is present when the decorrelation rate satisfies a prescribed threshold.

3. The method according to claim 2, wherein the decorrelation rate satisfies the prescribed threshold when the decorrelation rate increases above the prescribed threshold.

4. The method according to claim 2, wherein analyzing the plurality of autocorrelation coefficients to obtain the decorrelation rate comprises determining a slope coefficient of a linear fit of the autocorrelation coefficients, and using a negative of the slope coefficient as the decorrelation rate.

5. The method according to claim 4, wherein determining the slope of the linear fit of the autocorrelation coefficients comprises using the equation $\hat{r}_k = -\gamma \ln k + c_1$ to perform the linear fit $\hat{r}_k$, where $-\gamma$ is the decorrelation rate, k is a non-negative integer, and $c_1$ is a constant.

6. The method according to claim 4, wherein determining the slope coefficient comprises analyzing the linear fit $\hat{r}_k$ a logarithmic scale.

7. The method according to claim 1, wherein analyzing the data set of current measurements and the data set of voltage measurements for the presence of pink noise comprises determining a rescaled-range (RS) coefficient based on the data set of current measurements and the data set of voltage measurements, and concluding pink noise is present when a magnitude of the RS coefficient exceeds a prescribed threshold.

8. The method according to claim 7, wherein determining the RS coefficient comprises:
    a) subdividing the data set of voltage measurements and the data set of current measurements in to m sections each having a subdivision length n;
    b) determining a rescaled range for each subdivision of the data set of voltage measurements and the data set of current measurements;
    c) based on the rescaled range for each subdivision, determining if the subdivision length n can be increased;
    d) repeating steps a-c so long as the subdivision length n can be increased; and
    e) upon the subdivision length n reaching a maximum, determining a linear slope of a log rescaled range based on the last determined rescaled range of subdivisions.

9. The method according to claim 8, wherein determining if the subdivision length n can be increased comprises determining if there is a new subdivision length n that is greater than the previously determined subdivision length n that is divisible for the length of the entire data set of voltage measurements and current measurements.

10. The method according to claim 8, wherein calculating the rescaled range for each subdivision of the data set of voltage measurements and the data set of current measurements comprises:
    determining an unbiased standard deviation for each subdivision of the data sets of voltage measurements and current measurements;
    determining a cumulative sum of each subdivision of the data sets of voltage measurements and current measurements;
    determining a range of the cumulative sum for each subdivision of the data sets of voltage measurements and current measurements; and determining the rescaled range for each subdivision of the data sets of voltage measurements and current measurements based on the range of cumulative sum of each subdivision and the unbiased standard deviation of each subdivision.

11. An arc fault detection system, comprising:
a voltage sensor connectable to a photovoltaic (PV) string;
a current sensor connectable to a PV string; and
a controller communicatively coupled to the voltage sensor and the current sensor to receive voltage measurements and current measurements therefrom, the controller configured to:
obtain from the voltage sensor a voltage output by the PV string over a prescribed time period to obtain a data set of voltage measurements;
obtain from the current sensor a current output by the PV string over the prescribed time period to obtain a data set of current measurements;
determine if the data set of voltage measurements and the data set of current measurements are simultaneously decreasing within the prescribed time period;
analyze the data set of current measurements and the data set of voltage measurements for the presence of pink noise within the prescribed time period; and
output an indication of an arc fault when
i) pink noise is present during the prescribed time period, and
ii) at least a portion of the data set of voltage measurements and at least a portion of the data set of current measurements are simultaneously decreasing while pink noise is present.

12. The system according to claim 11, wherein to analyze for the presence of pink noise, the controller is configured to:
obtain from the data set of voltage measurements and the data set of current measurements a plurality of autocorrelation coefficients;
analyze the plurality of autocorrelation coefficients to obtain a decorrelation rate; and
conclude pink noise is present when the decorrelation rate satisfies a prescribed threshold.

13. The system according to claim 12, wherein the decorrelation rate satisfies the prescribed threshold when the decorrelation rate increases above the prescribed threshold.

14. The system according to claim 12, wherein to analyze the plurality of autocorrelation coefficients to obtain the decorrelation rate, the controller is configured to determine a slope coefficient of a linear fit of the autocorrelation coefficients, and use a negative of the slope coefficient as the decorrelation rate.

15. The system according to claim 14, wherein to determine the slope of the linear fit of the autocorrelation coefficients, the controller is configured to use the equation $\hat{r}_k = -\gamma \ln k + c_1$ to perform the linear fit $\hat{r}_k$, where $-\gamma$ is the decorrelation rate, k is a non-negative integer, and $c_1$ is a constant.

16. The system according to claim 14, wherein to determine the slope coefficient the controller is configured to analyze the linear fit $\hat{r}_k$ a logarithmic scale.

17. The system according to claim 11, wherein to analyze for the presence of pink noise, the controller is configured to:
determine a rescaled-range (RS) coefficient based on the data set of current measurements and the data set of voltage measurements, and
conclude pink noise is present when a magnitude of the RS coefficient exceeds a prescribed threshold.

18. The system according to claim 17, wherein to determine the RS coefficient the controller is configured to:
a) subdivide the data set of voltage measurements and the data set of current measurements in to m sections each having a subdivision length n;
b) determine a rescaled range for each subdivision of the data set of voltage measurements and the data set of current measurements;
c) based on the rescaled range for each subdivision, determine if the subdivision length n can be increased;
d) repeat steps a-c so long as the subdivision length n can be increased; and
e) upon the subdivision length n reaching a maximum, determine a linear slope of a log rescaled range based on the last determined rescaled range of subdivisions.

19. The system according to claim 18, wherein to determine if the subdivision length n can be increased the controller is configured to determine if there is a new subdivision length n that is greater than the previously determined subdivision length n that is divisible for the length of the entire data set of voltage measurements and current measurements.

20. The system according to claim 18, wherein to calculate the rescaled range for each subdivision of the data set of voltage measurements and the data set of current measurements the controller is configured to:
determine an unbiased standard deviation for each subdivision of the data sets of voltage measurements and current measurements;
determine a cumulative sum of each subdivision of the data sets of voltage measurements and current measurements;
determine a range of the cumulative sum for each subdivision of the data sets of voltage measurements and current measurements; and
determine the rescaled range for each subdivision of the data sets of voltage measurements and current measurements based on the range of cumulative sum of each subdivision and the unbiased standard deviation of each subdivision.

21. A controller for detecting the occurrence of an arc fault in a photovoltaic (PV) string, the controller configured to:
obtain a voltage output by the PV string over a prescribed time period to obtain a data set of voltage measurements;
obtain a current output by the PV string over the prescribed time period to obtain a data set of current measurements;
determine if the data set of voltage measurements and the data set of current measurements are simultaneously decreasing within the prescribed time period;
analyze the data set of current measurements and the data set of voltage measurements for the presence of pink noise within the prescribed time period; and
output an indication of an arc fault when
i) pink noise is present during the prescribed time period, and
ii) at least a portion of the data set of voltage measurements and at least a portion of the data set of current measurements are simultaneously decreasing while pink noise is present.

* * * * *